United States Patent
Wu et al.

(10) Patent No.: US 12,143,004 B2
(45) Date of Patent: Nov. 12, 2024

(54) CHARGING CIRCUIT FOR BOOTSTRAP CAPACITORS

(71) Applicant: Murata Manufacturing Co., Ltd., Kyoto (JP)

(72) Inventors: Gary Chunshien Wu, San Diego, CA (US); Gregory Szczeszynski, Nashua, NH (US)

(73) Assignee: Murata Manufacturing Co., Ltd., Kyoto (JP)

( * ) Notice: Subject to any disclaimer, the term of this patent is extended or adjusted under 35 U.S.C. 154(b) by 209 days.

(21) Appl. No.: 17/752,492

(22) Filed: May 24, 2022

(65) Prior Publication Data

US 2023/0387796 A1  Nov. 30, 2023

(51) Int. Cl.
*H02M 1/088* (2006.01)
*H02M 3/07* (2006.01)
*H02M 3/158* (2006.01)

(52) U.S. Cl.
CPC ............. *H02M 1/088* (2013.01); *H02M 3/07* (2013.01); *H02M 3/158* (2013.01)

(58) Field of Classification Search
CPC ......... H02M 1/088; H02M 3/158; H02M 3/07
See application file for complete search history.

(56) References Cited

U.S. PATENT DOCUMENTS

| | | | |
|---|---|---|---|
| 10,686,367 B1 | 6/2020 | Low | |
| 10,720,842 B1 | 7/2020 | Wu et al. | |
| 10,720,843 B1 | 7/2020 | Wu et al. | |

(Continued)

FOREIGN PATENT DOCUMENTS

| | | |
|---|---|---|
| CN | 101312328 | 11/2008 |
| WO | 94/27370 | 11/1994 |

OTHER PUBLICATIONS

Jung Jun-Hyung, et al., "A Carrier-Based PWM Control Strategy for Three-Level NPC Inverter Based on Bootstrap Gate Drive Circuit", IEEE Transactions on Power Electronics, Institute of Electrical and Electronics Engineers, USA, vol. 35, No. 3, Mar. 1, 2020, pp. 2843-2860.

(Continued)

*Primary Examiner* — Jue Zhang
(74) *Attorney, Agent, or Firm* — JAQUEZ LAND GREENHAUS & MCFARLAND LLP; John Land, Esq.

(57) ABSTRACT

Power converter circuits and methods that include self-timed bootstrap capacitor power sources. Added to a power converter having a diode stack for charging bootstrap capacitors are three types of supplemental circuit blocks: a trigger block, a trigger-bypass block, and a bypass block. In operation, adjacent supplemental circuit blocks work in pairs. The upper block of the pair functions, when triggered, to charge an associated bootstrap capacitor by connecting the top plate of its associated bootstrap capacitor to the top plate of the bootstrap capacitor associated with the lower block of the pair, essentially bypassing the diode associated with the upper block. In addition, the lower block of the pair functions to initiate (trigger) the bypass function of the upper block. The bypass function of the upper block automatically terminates when the connected bootstrap capacitors are disconnected and their respective voltages "fly" apart, or is controllably terminated.

20 Claims, 12 Drawing Sheets

(56) References Cited

U.S. PATENT DOCUMENTS

| | | |
|---|---|---|
| 10,770,974 B2 | 9/2020 | Wu et al. |
| 10,992,226 B1 | 4/2021 | Aboueldahab et al. |
| 2019/0028094 A1* | 1/2019 | Reusch ................ H02M 1/088 |

OTHER PUBLICATIONS

Kellner, Alexandra, International Search Report and Written Opinion received from the EPO dated Aug. 8, 23 for appln. No. PCT/US2023/022604, 11 pgs.

Szczeszynski, Gregory, "Controlling Charge-Balance and Transients in a Multi-Level Power Converter" filed Nov. 5, 2021, U.S. Appl. No. 63/276,923, 104 pgs.

* cited by examiner

CHARGING CIRCUIT FOR BOOTSTRAP CAPACITORS

BACKGROUND

(1) Technical Field

This invention relates to electronic circuits, and more particularly to power converter circuits, including DC-DC power converter circuits.

(2) Background

Many electronic products, particularly mobile computing and/or communication products and components (e.g., cell phones, notebook computers, ultra-book computers, tablet devices, LCD and LED displays) require multiple voltage levels. For example, radio frequency (RF) transmitter power amplifiers may require relatively high voltages (e.g., 12V or more), whereas logic circuitry may require a low voltage level (e.g., 1-3V). Still other circuitry may require an intermediate voltage level (e.g., 5-10V).

Direct current power converters are often used to generate a lower or higher voltage from a common power source, such as batteries, solar cells, fuel cells, and rectified AC sources. Power converters which generate a lower output voltage level from a higher input voltage power source are commonly known as buck converters, so-called because the output voltage $V_{OUT}$ is less than the input voltage $V_{IN}$, and hence the converter is "bucking" the input voltage. Power converters which generate a higher output voltage level from a lower input voltage power source are commonly known as boost converters, because $V_{OUT}$ is greater than $V_{IN}$. Some power converters may be either a buck converter or a boost converter depending on which terminals are used for input and output. Some power converters may provide an inverted output. Some power converters known as multi-level converters use charge transfer capacitors that are commonly referred to as "fly capacitors" or "pump capacitors".

FIG. 1 is a block diagram of a circuit that includes a prior art power converter 100. In the illustrated example, the power converter 100 includes a converter cell 102 and a controller 104. The converter cell 102 is configured to receive an input voltage $V_{IN}$ from a voltage source 106 (e.g., a battery) across terminals V1+, V1− (common), and transform the input voltage $V_{IN}$ into an output voltage $V_{OUT}$ across terminals V2+, V2− (common). The output voltage $V_{OUT}$ is generally coupled across an output capacitor $C_{OUT}$, across which may be connected a load represented as an equivalent resistance R.

The controller 104 receives a set of input signals and produces a set of output signals. Some of these input signals arrive along a signal path 110 connected to the converter cell 102. Some input signals carry information indicative of the operational state of the converter cell 102. The controller 104 generally also receives one or more external input/output signals I/O that may be analog, digital (encoded or direct signal lines), or a combination of both, and a clock/timing signal CLK (although some controllers may be configured for asynchronous operation, e.g., a hysteretic controller or a constant on time controller). Based upon the received input signals, the controller 104 produces a set of control signals back to the converter cell 102 on the signal path 110 that control the internal components of the converter cell 102 (e.g., internal switches, such as FETs, especially MOSFETs) to cause the converter cell 102 to convert $V_{IN}$ to $V_{OUT}$. In some embodiments, an auxiliary circuit (not shown) may provide various signals to the controller 104 (and optionally directly to the converter cell 102), such as the clock signal CLK, the input/output signals I/O, as well as various voltages, such as a general supply voltage $V_{DD}$ and a transistor bias voltage VBIAS.

In some power converter designs, such as multi-level converters, the converter circuit 102 uses an inductor as an energy storage element. For example, FIG. 2 is a schematic diagram of a prior art 4-level DC-to-DC buck converter cell 200 that may be used as the converter circuit 102 of FIG. 1. A set of FET power switches M1-M6 (generically, Mn) is series-coupled between $V_{IN}$ and a reference potential (e.g., circuit ground or 0V relative to $V_{IN}$). An inductor L is coupled to an output capacitor $C_{OUT}$ and to a node $L_X$ between FET power switches M3 and M4. The FET power switches M1-M3 coupled between node $L_X$ and circuit ground are the "low-side" switches, while the FET power switches M4-M6 coupled between node $L_X$ and $V_{IN}$ are the "high-side" switches.

The multi-level converter cell 200 converts an input voltage $V_{IN}$ to an output voltage $V_{OUT}$ by actively switching the series-connected FET power switches M1-M6. The state transition patterns of the power switches determine operational zones and corresponding $V_{OUT}$ ranges. In the example of FIG. 2, the inductor L is bracketed by two sets of the series-connected FET power switches, M1-M3 and M4-M6. Each adjacent pair of power switches in the first and second sets of FET power switches is separated by a respective node. The node between each adjacent pair of FET power switches in one set is coupled by a corresponding fly capacitor $C_{Fx}$ to the corresponding node between each pair of FET power switches in the other set. For example, in FIG. 2, node T1 between FET power switches M4 and M5 is coupled by fly capacitor $C_{F1}$ to node B1 between FET power switches M2 and M3. Similarly, node T2 between FET power switches M5 and M6 is coupled by fly capacitor $C_{F2}$ to node B2 between FET power switches M1 and M2. Controlling clock signals for each set of power switches are complementary and are provided by a control circuit (not shown).

Voltage detectors 202a, 202b, such as simple comparator-type circuits, may be used to sense the voltage across a corresponding fly capacitor $C_{Fx}$ with respect to a reference voltage, $V_{REF}$, which represents a desired target voltage for the fly capacitor $C_{Fx}$. The output of each voltage detector 202a, 202b may be a simple voltage HIGH/LOW status signal, $C_{Fx\_H/L}$, which may be coupled to a control circuit (not shown).

In the illustrated example, the control gate of each FET power switch Mn is coupled to a corresponding level-shifter/driver (LS/D) circuit 204 (although in some cases, level shifting circuitry in not required). A clock signal $\varphi_n$ coupled as an input to each LS/D circuit 204 controls the ON or OFF state of the corresponding FET power switch Mn. The clock signals may be generated, for example, by the controller 104 shown in FIG. 1.

Powering the LS/D circuits 204 effectively, efficiently, and with minimal circuitry is a desirable design goal.

SUMMARY

The present invention encompasses power converter circuits and methods that include self-timed bootstrap capacitor power sources.

Added to a power converter having a diode stack for charging bootstrap capacitors are three types of supplemental circuit blocks: a trigger block, a trigger-bypass block, and a bypass block (in some embodiments, a trigger-bypass block may be used in lieu of a bypass block or a trigger-block). In operation, adjacent supplemental circuit blocks work in pairs. The upper block of the pair functions, when triggered, to charge an associated bootstrap capacitor by connecting the top plate of its associated bootstrap capacitor to the top plate of the bootstrap capacitor associated with the lower block of the pair, essentially bypassing the diode associated with the upper block. In addition, the lower block of the pair functions to initiate (trigger) the bypass function of the upper block. The bypass function of the upper block automatically terminates when the connected bootstrap capacitors are disconnected and their respective voltages "fly" apart, or is controllably terminated. In some applications, the diode stack includes explicit Schottky diodes, while in other applications the diode stack comprises the intrinsic diodes of PFET switches within the supplemental circuit blocks.

Notably, the timing of the bypass function turning ON and then OFF is simply a matter of the charging behavior of the bootstrap capacitors and the internal signal propagation timing between supplemental circuit blocks. The only control signals passed between any two bootstrap capacitor stacks are all self-contained—no external inputs and/or synchronous control logic is needed.

Generally, the present invention encompasses circuits and methods that provide for transferring charge among a plurality of bootstrap capacitors of a power converter having a plurality of power switches, each bootstrap capacitor having a top plate and a bottom plate, wherein the top plates of each adjacent pair of bootstrap capacitors are coupled by a respective diode within a diode stack, the circuits and methods configured to perform one or both of the following functions: provide a trigger signal after an associated one of the plurality of power switches is switched to a conductive state and thereby connects the bottom plates of an adjacent pair of bootstrap capacitors; and/or initiate, in response to receipt of the trigger signal, a bypass function with respect to the respective diode coupling the adjacent pair of bootstrap capacitors.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses power converter circuits and methods that include self-timed bootstrap capacitor power sources. More specifically, the present invention encompasses circuits and methods that provide for transferring charge among a plurality of bootstrap capacitors of a power converter having a plurality of power switches, each bootstrap capacitor having a top plate and a bottom plate, wherein the top plates of each adjacent pair of bootstrap capacitors are coupled by a respective diode within a diode stack, the circuits and methods configured to perform one or both of the following functions: providing a trigger signal after an associated one of the plurality of power switches is switched to a conductive state and thereby connects the bottom plates of an adjacent pair of bootstrap capacitors; and/or initiating, in response to receipt of the trigger signal, a bypass function with respect to the respective diode coupling the adjacent pair of bootstrap capacitors.

Diode-Charged Bootstrap Capacitors

Figure 3:
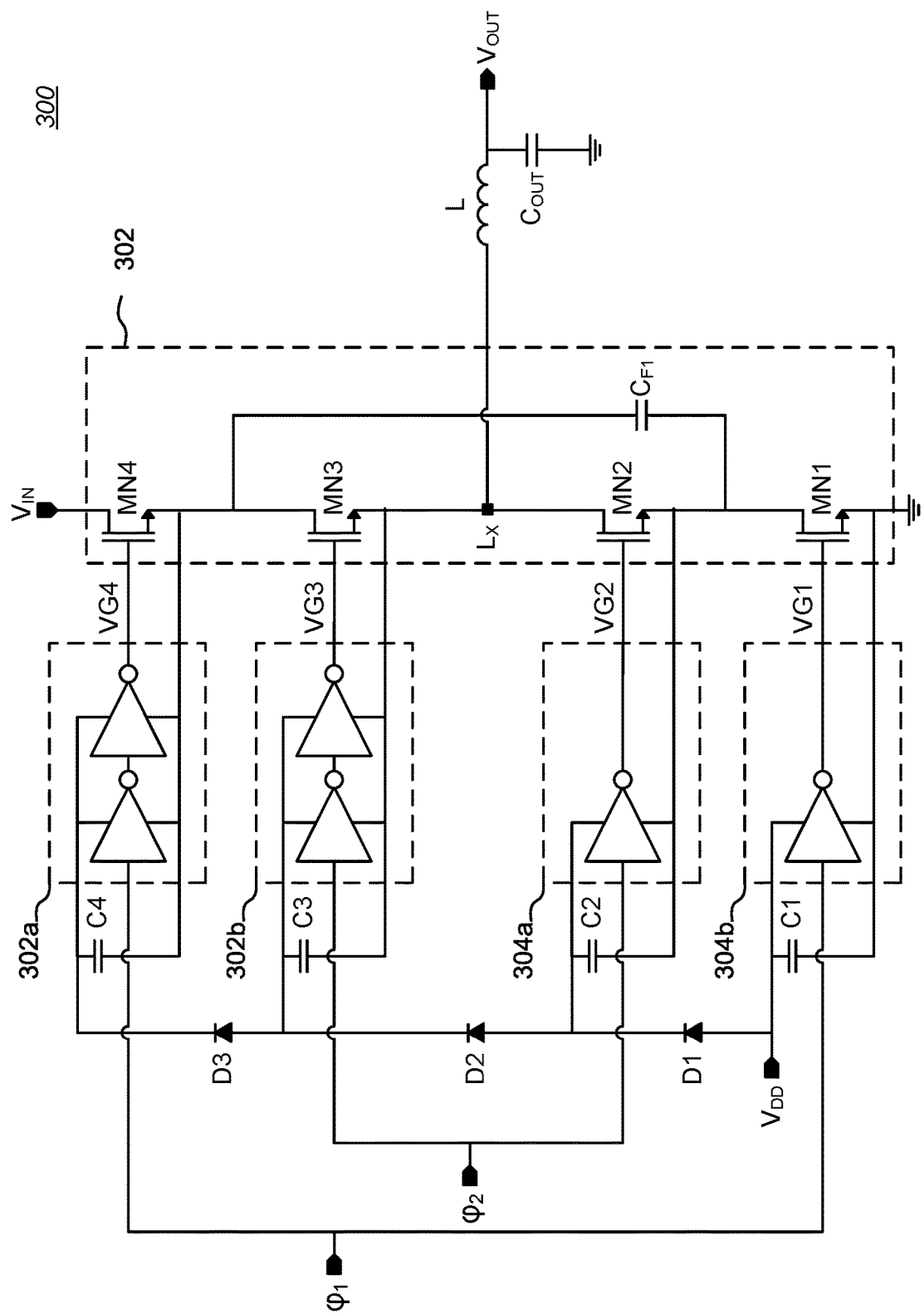
FIG. 3 is a schematic diagram of a 3-level multi-level power converter implemented with NFET power switches.

In many power converters, particularly multi-level power converters, it may be common to utilize N-type MOSFETs (NFETs) for the FET power switches because NFETs are characterized by a much lower (better) $R_{ON} \times Q_G$ figure of merit compared to P-type MOSFETs (PFETs), where $Q_G$ is the total gate charge required to turn ON a FET to achieve a specified $R_{ON}$. For example, FIG. 3 is a schematic diagram of a 3-level multi-level power converter 300 implemented with NFET power switches. In this example, clock signals $\varphi_1$ and $\varphi_2$ are applied to the control gates of a set 302 of series-coupled NFET power switches MN1-MN4 through either a non-inverting driver circuit 302a, 302b or an inverting driver circuit 304a, 304b. In some embodiments, the number of constituent inverters (or buffers) within the driver circuits 302x, 304x may be increased to accommodate signal delay requirements. Level shifter circuitry is omitted in this example but may be needed in some embodiments, depending on the value of $V_{IN}$ and the number of tiers in a multi-level power converter.

The output VG1-VG4 of each driver circuit 302x, 304x is coupled to the control gate of a respective NFET power switch MN1-MN4. A fly capacitor $C_{F1}$ is coupled to nodes between adjacent low-side NFET power switches MN1 and MN2 and between adjacent high-side NFET power switches MN3 and MN4. An inductor L is coupled to an output capacitor $C_{OUT}$ and to a node $L_X$ between NFET power switches MN2 and MN3.

The downside of using NFETs in a switching power converter is that NFETs are referenced to their source, which is the low voltage side of a power converter. One way of providing a suitable gate bias for each NFET power switch MNn and to power associated driver circuitry (and level shifter circuitry, if present) is to couple a bootstrap capacitor to the source of an associated NFET power switch and charge each bootstrap capacitor to a voltage that is sufficient to enable switching of the gate of the associated power switch NFET.

Referring again to FIG. 3, power to each driver circuit 302x, 304x is provided by charge stored on a corresponding bootstrap capacitor Cn (in this example, n=1 . . . 4) coupled to voltage inputs of the driver circuits 302x, 304x. Each bootstrap capacitor Cn should be sized to provide at least sufficient charge, with minimal voltage drop, to allow the driver circuits 302x, 304x to switch the state of the associated NFET power switches Mn (the control gates of which are relatively large capacitive structures). Generally, all of the bootstrap capacitors Cn lose charge in switching the gate of the associated NFET power switch. Further, the bootstrap capacitors Cn lose charge even when not switching an associated power switch, such as through DC current drain from other connected circuitry (e.g., bias currents for analog circuits). Accordingly, the bootstrap capacitors Cn need to be periodically recharged during startup and during normal operation to replenish lost charge.

In a conventional 2-level DC-DC converter (which is not considered to be a "multi-level" converter), there are only two NFET power switches and no fly capacitor $C_{F1}$. The low-side NFET power switch is typically referenced to circuit ground so its gate driver supply can be connected directly to a fixed supply (e.g., $V_{DD}$). The source of the high-side NFET power switch is referenced to node $L_X$ and accordingly needs a floating gate driver supply, which may be provided by an associated bootstrap capacitor. The high-side bootstrap capacitor needs to be periodically recharged to replenish the lost charge. This can be accomplished by providing a diode with its anode connected to the fixed supply and its cathode connected to the top plate of the high-side bootstrap capacitor. When node $L_X$ (which is coupled both to the bottom plate of the high-side bootstrap capacitor and to the source of the high-side NFET power switch) is at 0V level, the high-side bootstrap capacitor is charged to the voltage level of the fixed supply, minus the forward bias voltage drop of the diode. This works well since node $L_X$ (the source of the high-side switch) is forced to 0V when the low-side NFET power switch turns ON (conducts).

In a true multi-level converter, including series-capacitor buck, charge pump, and resonant charge pump circuits, there are usually more than two NFET power switches connected in series. Thus, the source of some NFET power switches will not be at 0V level during operation, so the associated bootstrap capacitors cannot be charged from the fixed voltage supply connected to the bootstrap capacitor powering the lowest NFET power switch. However, the diode-only charging technique that works for a 2-level DC-DC converter has limitations for true multi-level power converters (e.g., 3-level, 4-level, and higher-level power converters). For instance, referring again to FIG. 3, each diode D1-D3 is coupled such that its anode is connected to the top plate of a lower bootstrap capacitor and its cathode connected to the top plate of the next higher bootstrap capacitor ("higher" meaning closer to the $V_{IN}$ terminal and "lower" meaning closer to the ground terminal). Thus, diode D1 is coupled between the top plates of bootstrap capacitors C1 and C2; diode D2 is coupled between the top plates of bootstrap capacitors C2 and C3; and diode D3 is coupled between the top plates of bootstrap capacitors C3 and C4. In addition, the anode of the lowest diode, D1, is coupled to $V_{DD}$.

Whenever an NFET power switch is ON (conducting), it connects the bottom plate of the next-higher bootstrap capacitor to the bottom plate on its associated bootstrap capacitor, so in a sense the two bootstrap capacitors "fly" together to the same voltage level. Conversely, whenever an NFET power switch is OFF (non-conductive or blocking), the bottom plates of those two adjacent bootstrap capacitors would be disconnected and thus "fly" apart to different voltage levels. Using FIG. 3 as an example, if $V_{IN}$=12V, then any OFF NFET power switch MNx would have about 6V separating the bottom plates of two adjacent bootstrap capacitors, and any ON NFET power switch would have 0V separating the bottom plates of two adjacent bootstrap capacitors.

Accordingly, the lowest bootstrap capacitor C1 is continually charged by $V_{DD}$; bootstrap capacitor C2 is charged by $V_{DD}$ through diode D1 when MN1 is closed (conducting); bootstrap capacitor C3 is charged by bootstrap capacitor C2 through diode D2 when MN2 is closed; and bootstrap capacitor C4 is charged by bootstrap capacitor C3 through diode D3 when MN2 is closed.

A problem that arises is that each successive higher diode incurs a forward-bias voltage drop that reduces the available charging voltage. For example, bootstrap capacitor C4 would see 3 diode voltage drops across diodes D1-D3, plus a capacitor charge redistribution voltage drop. Assuming that $V_{DD}$=5V, a diode forward-bias voltage drop of about 0.7V, and a charge redistribution voltage drop of about 0.3V, then bootstrap capacitor C2 would charge at a maximum of about 4V, C3 would charge at a maximum of about 3V, and C4 would charge at a maximum of only about 2V, which may not be enough for the corresponding driver circuit 302a to switch the associated NFET power switch MN4. The lower voltage available for higher tiers of bootstrap capacitors also results in larger switching delays for the associated buffer circuits, which may increase deadtime in the clock circuitry generating the clock signals $\varphi_1$ and $\varphi_2$ (or equivalent timing signals), thus limiting the switching rate of the power converter. The lower voltage available for higher tiers of bootstrap capacitors also makes the power switch FETs more resistive, and thus less efficient, due to a lower $V_{GS}$.

In addition to the voltage lost due to charge redistribution, the penalty of one diode forward-bias voltage drop for every charge transfer gets worse as the number of tiers in the stack of NFET power switches increases. For example, a 5-level multi-level converter would have a stack of 8 NFET power switches having associated bootstrap capacitors. If the bottom bootstrap capacitor is connected directly to a fixed supply (e.g., Von), there still be a stack of 7 higher bootstrap capacitors that each see a cumulative diode voltage drop due to all of the bootstrap capacitors below. For instance, the top-most bootstrap capacitor would see an accumulated 7 diode forward-bias voltage drops. Even if the diodes in FIG. 3 are replaced by Schottky diodes, which have a smaller forward-bias voltage drop compared to conventional diodes, the accumulation of diode forward-bias voltage drops may effectively "consume" much or all of the available voltage from the fixed supply.

Additional circuitry encompassed by the present invention overcomes the shortcomings of a diode-only charging technique for a multi-level converter.

Self-Timed Setting/Re-Setting Supplemental Circuits for Diode Stack

Figure 4A:
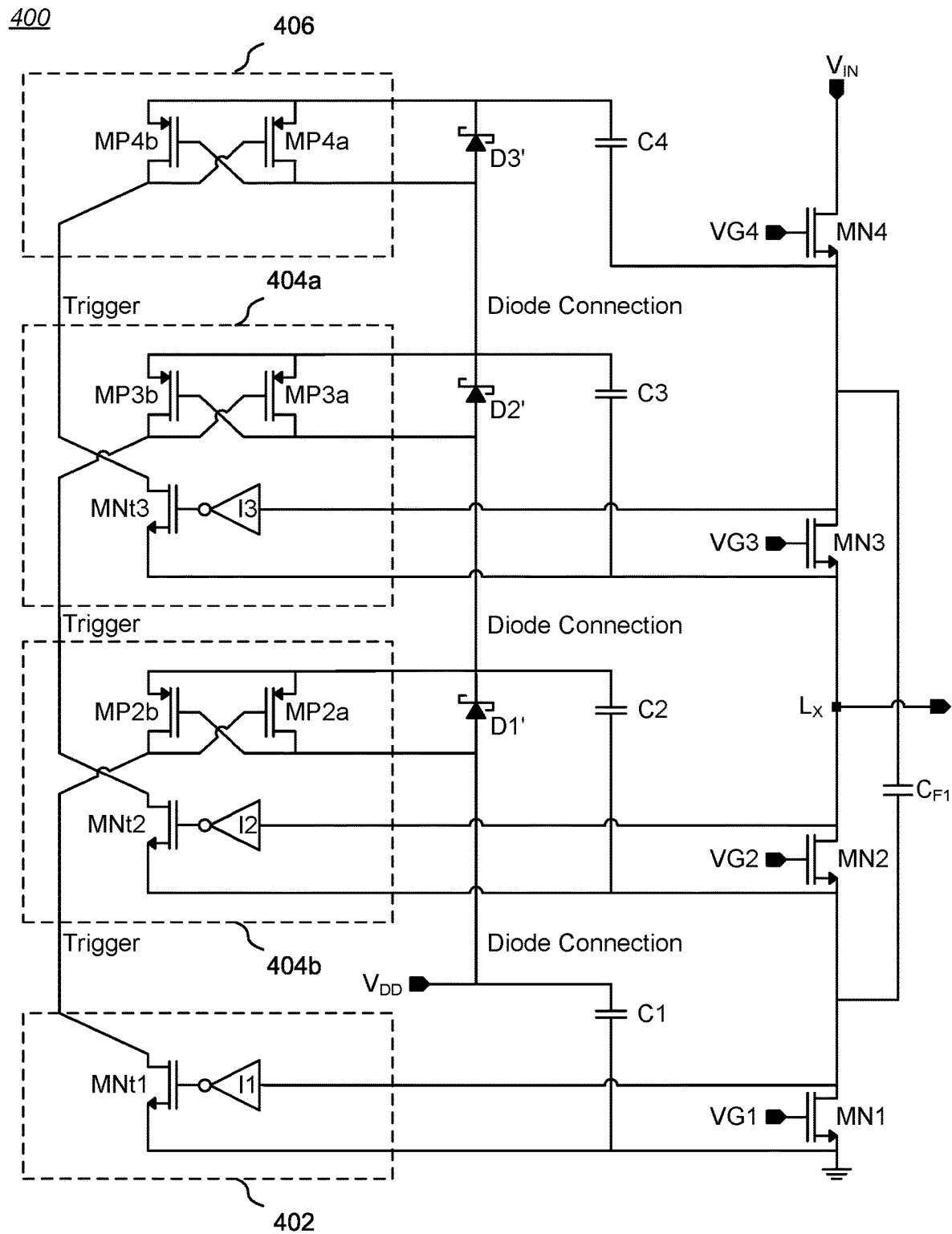
FIG. 4A is a schematic diagram of a portion of a 3-level multi-level power converter that includes a self-timed setting/resetting latch embodiment of the present invention.

FIG. 4A is a schematic diagram 400 of a portion of a 3-level multi-level power converter that includes a self-timed setting/resetting latch embodiment of the present invention. The illustrated circuit is similar to the circuit shown in FIG. 3 in a number of respects, but with details of the driver circuits 302x, 304x and the output circuitry (inductor L, capacitor $C_{OUT}$) omitted to avoid clutter. In addition, the diodes D1'-D3' are preferably Schottky diodes, which have a smaller forward-bias voltage drop compared to conventional diodes (note that in some embodiments, the explicit circuit component diodes D1'-D3' are not needed, as described in detail below). While a 3-level multi-level power converter is shown by way of example, the concepts of the present invention can readily be extended to higher order multi-level power converters. Level shifter circuitry is omitted in this example but may be needed in some embodiments, depending on the value of $V_{IN}$ and the number of tiers in a multi-level power converter.

Added to the circuit are three types of supplemental circuit blocks: a trigger block 402, a trigger-bypass block 404a, 404b, and a bypass block 406 (in some embodiments, a trigger-bypass block 404x may be used in lieu of a trigger block 402 and/or a bypass block 406, as explained further below).

The illustrated bypass block 406 includes a pair of cross-coupled PFETs MP4a, MP4b. The drain-source conduction channel of MP4a is coupled in parallel with associated diode D3' (i.e., the source of MP4a is coupled to the cathode of D3' while the drain of MP4a is coupled to the anode of D3'). The drain of MP4a is also coupled to the gate of MP4b. The drain-source conduction channel of MP4b is coupled between the cathode of D3' and the gate of MP4a. The drain of MP4b is also coupled to a Trigger signal line from the adjacent lower-tier supplemental circuit block 404a. Accordingly, the sources of MP4a and MP4b are also coupled to the top plate of bootstrap capacitor C4.

The illustrated trigger-bypass blocks 404a, 404b respectively include a pair of cross-coupled PFETs MP3a, MP3b and MP2a, MP2b configured like the pair of cross-coupled PFETs MP4a, MP4b of the illustrated bypass block 406. Thus, the conduction channel of MP3a is coupled in parallel with associated diode D2' and the conduction channel of MP2a is coupled in parallel with associated diode D1'. Similarly, the conduction channel of MP3b is coupled between the cathode of D2' and the gate of MP3a, and to a Trigger signal line from the adjacent lower-tier supplemental circuit block 404b, while the conduction channel of MP2b is coupled between the cathode of D1' and the gate of MP2a, and to a Trigger signal line from the adjacent lower-tier supplemental circuit block 402.

Also included in each trigger-bypass block 404a, 404b is a respective inverter I3, I2 having an input coupled to the drain of a respective NFET power switch MN3, MN2 and an output coupled to the gate of a respective trigger NFET MNt3, MNt2. The conduction channel of trigger NFET MNt3 is coupled between the gate of MP4a and the source of NFET power switch MN3 and selectively provides a Trigger signal to MP4a. The conduction channel of trigger NFET MNt2 is coupled between the gate of MP3a and the source of NFET power switch MN2 and selectively provides a Trigger signal to MP3a. Note that a level shifter (not shown) may be needed to translate the levels between the maximum $V_{DS}$ of each MNtx and the corresponding inverter inputs (I1, I2, and I3 in this example). Also, the voltage supplies for the inverters I1, I2, and I3 are derived from the respective bootstrap capacitors C1, C2, and C3, and may require corresponding voltage reduction circuits if the bootstrap capacitor voltage exceeds the maximum supply voltage tolerated by the inverters.

As should be clear, the bypass block 406 is similar to the trigger-bypass blocks 404x but omits an inverter and trigger NFET. Thus, a trigger-bypass block 404x may be used in place of a bypass block 406.

The trigger block 402 includes an inverter I1 having an input coupled to the drain of NFET power switch MN1 and an output coupled to the gate of a trigger NFET MNt1. The conduction channel of trigger NFET MNt1 is coupled between the gate of MP2a and the source of NFET power switch MN1 and selectively provides a Trigger signal to MP2a.

In operation, adjacent supplemental circuit blocks 402, 404x, 406 work in pairs. The upper block of the pair functions, when triggered, to charge an associated bootstrap capacitor by connecting the top plate of its associated bootstrap capacitor to the top plate of the bootstrap capacitor associated with the lower block of the pair, essentially bypassing the diode associated with the upper block. In addition, the lower block of the pair functions to initiate (Trigger) the bypass function of the upper block. The bypass function of the upper block automatically terminates when the connected bootstrap capacitors are disconnected and their respective voltages "fly" apart.

Notably, in this embodiment, the timing of the bypass function turning ON and then OFF is simply a matter of the charging behavior of the bootstrap capacitors and the internal signal propagation timing between supplemental circuit blocks. The only control signals passed between any two bootstrap capacitor stacks are all self-contained—no external inputs and/or synchronous control logic is needed.

Focusing on adjacent trigger-bypass blocks 404a and 404b as an example of operation, while gate control voltage VG2 is applied to NFET power switch MN2, then MN2 will turn ON, thereby connecting the bottom plate of bootstrap capacitor C2 to the bottom plate of bootstrap capacitor C3. Accordingly, charge begins to transfer from the top plate of C2 through diode D2' to the top plate of C3. In the meantime, the ON state of MN2 causes the input of inverter I2 to be low, causing the output of inverter I2 to be high, in turn causing trigger NFET MNt2 to turn ON (conduct). The conductive state of trigger NFET MNt2 connects the gate of MP3a to a relatively low voltage (circuit ground in the case of MNt1) with respect to the voltage at the source of MP3a, and thus acts as a Trigger signal that causes the gate voltage on PFET MP3a to be negative and allows MP3a to conduct some delay time after MN2 turns ON. When MP3a conducts, it effectively bypasses diode D2' and connects the top plate of C3 directly to the top plate of C2, imposing essentially no voltage drop penalty (especially compared to diode D2 in FIG. 3) with respect to charge transfer from C2 to C3. In this state, MP3b is OFF (blocking).

When the gate control voltage VG2 turns the NFET power switch MN2 OFF, then MN2 ceases conducting, which allows the voltages on the previously parallel-connected bootstrap capacitors C2 and C3 to move apart, with the top plate of C2 being more negative than the top plate of C3. A sufficient voltage differential causes MP3b to turn ON, thereby applying an essentially zero $V_{GS}$ to the gate of PFET MP3a, turning MP3a OFF and thus preventing charge on C3 from flowing back to C2 through MP3a.

There may be a short delay in turning MP3a OFF while the voltages on bootstrap capacitors C3 and C2 move apart, but the cross-coupled PFET pair MP3a/MP3b is generally very fast so the delay is usually very small (believed to be about 1 ns or less), which gives very minimal time for any reverse transfer of charge from the higher bootstrap capacitor C3 back to the lower bootstrap capacitor C2.

When MN2 is turned OFF, the Trigger signal generated by MNt2 also ceases to be generated after some delay time (i.e., MNt2 reverts to a blocking state). Note that MNt2 may not yet have shut OFF when MP3b turns ON, owing to signal delays through inverter I2 and MNt2 itself, and technically would still shunt the gate of MP3a to a relatively low voltage. However, by sizing MP3b to be significantly larger than MNt2 (e.g., by a factor of 10 on width with the same channel length), MP3b overwhelms the shunting effect of MNt2 to rapidly turn cross-coupled MP3a OFF. It may also be noted that MP3b need not be particularly large with respect to MP3a, since MP3b is only controlling a gate voltage. For example, MP3b may be significantly smaller than MP3a (e.g., by a factor of $1/10^{th}$ on width with the same channel length).

A bypass block 406 works in the same fashion in tandem with an adjacent lower tier trigger-bypass block 404x, but, as the top supplemental circuit block, a bypass block 406 need not generate a Trigger signal.

A trigger block 402 works in a similar fashion to provide a Trigger signal to an adjacent higher tier trigger-bypass block 404x. However, as the bottom supplemental circuit block for a bootstrap capacitor C1 coupled to a fixed voltage supply, the cross-coupled PFET circuitry of a trigger-bypass block 404x may be omitted.

Figure 4B:
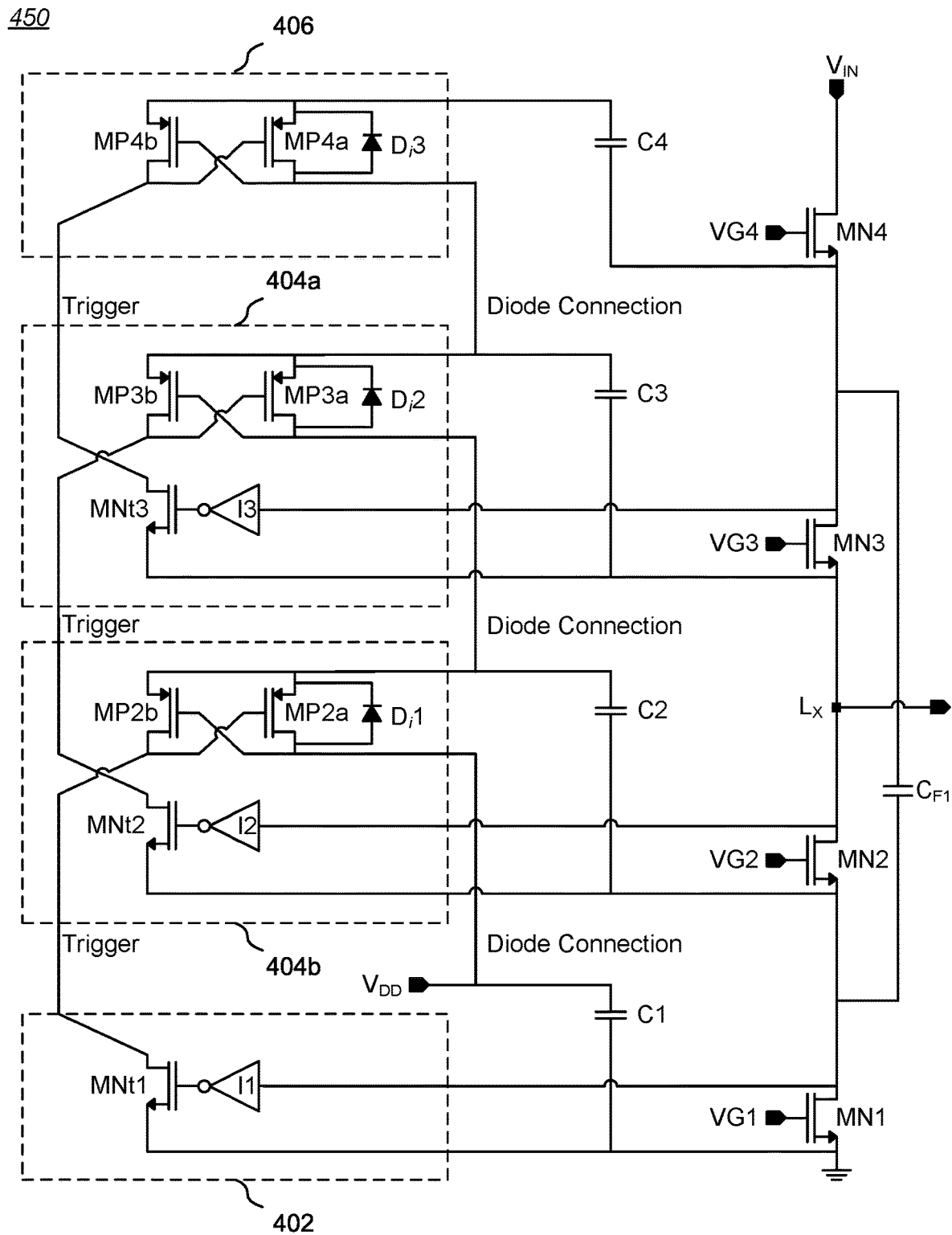
FIG. 4B is a schematic diagram of a portion of a 3-level multi-level power converter that includes a self-timed setting/resetting latch embodiment of the present invention that advantageously utilizes intrinsic body diodes.

Self-Timed Setting/Re-setting Supplemental Circuits Utilizing Intrinsic Body Diodes The embodiment of FIG. 4A utilizes explicit circuit component diodes D1'-D3'. However, in some applications, the explicit diodes D1'-D3' may be omitted, instead relying upon the intrinsic body diode of a MOSFET device to perform essentially the same function. For example, FIG. 4B is a schematic diagram 450 of a portion of a 3-level multi-level power converter that includes a self-timed setting/resetting latch embodiment of the present invention that advantageously utilizes intrinsic body diodes. It is common practice to omit a schematic representation of an intrinsic body diode from the symbol for an NFET or PFET. However, in FIG. 4B, the symbols for PFETs MP2a-MP4a have been augmented to include their respective intrinsic body diode Di1-Di3. As a comparison of FIG. 4B to FIG. 4A shows, the circuitry of FIG. 4B is essentially identical to the circuitry of FIG. 4A and operates in essentially the same manner (noting that body diodes are regular pn junction diodes with a larger forward bias drop compared to Schottky diodes). Again, level shifter circuitry is omitted in this example but may be needed in some embodiments, depending on the value of $V_{IN}$ and the number of tiers in a multi-level power converter.

Self-Timed Setting/Controlled Re-setting Supplemental Circuits for Diode Stack

As noted above, the operation of the embodiments of FIGS. 4A and 4B is entirely a function of the charging behavior of the bootstrap capacitors and the internal signal propagation timing between supplemental circuit blocks. However, in some applications, transient voltage swings may occur within a power converter that would disrupt the pattern of adjacent bootstrap capacitors charging after their bottom plates are disconnected from a common potential, when the capacitors begin "flying" apart to different voltages. For example, while the bottom plates of bootstrap capacitors C2 and C3 are connected together when trigger NFET MNt2 is ON, there is no issue with a transient effect because the ON resistance of MNt2 is very low, so the bottom plates are forced together. When MNt2 turns OFF, the voltages on C2 and C3 begin to fly apart, but due to certain transient conditions, the bottom plates of C2 and C3 may momentarily come together, which causes PFET MP3a to unintentionally turn ON. Such transient voltage swings may thus cause the diode bypass function of the trigger-bypass blocks 404x and the bypass block 406 supplemental circuits to stay ON (conducting) for too long, or to be triggered, thus discharging their associated bootstrap capacitor.

To accommodate the possibility of such transient voltage swings and/or to alleviate any concern that the diode bypass function of the PFETs MP2a-MP4a might be inadvertently activated or stay activated too long, a hybrid circuit provides for self-timed setting but controlled resetting of the diode bypass function of the PFETs MP2a-MP4a. More specifically, the hybrid circuit utilizes the internal signal propagation timing between supplemental circuit blocks to initiate the diode bypass function of the trigger-bypass blocks 404x and the bypass block 406, but uses logic signals derived from associated gate control voltage signals for the NFET power switches to force the PFETs MP2a-MP4a to an OFF state, thereby terminating their diode bypass function.

Figure 5:
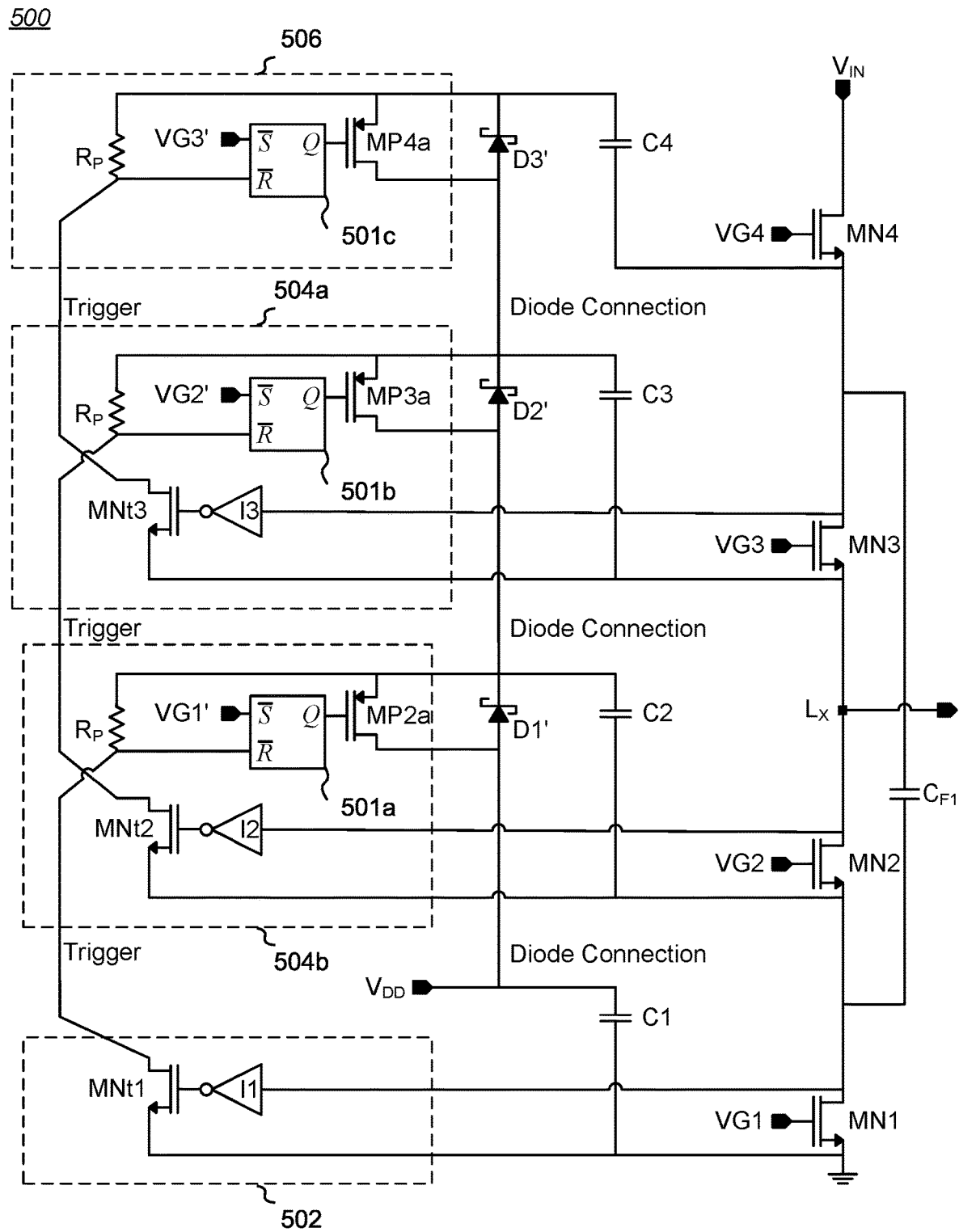
FIG. 5 is a schematic diagram of a portion of a 3-level multi-level power converter that includes a self-timed setting/controlled resetting latch embodiment of the present invention.

FIG. 5 is a schematic diagram 500 of a portion of a 3-level multi-level power converter that includes a "controlled setting/self-timed resetting" latch embodiment of the present invention. Level shifter circuitry is omitted in this example but may be needed in some embodiments, depending on the value of $V_{IN}$ and the number of tiers in a multi-level power converter.

Similar in many aspects to the embodiment shown in FIG. 4A, the embodiment shown in FIG. 5 includes three types of supplemental circuit blocks: a trigger block 502, a trigger-bypass block 504a, 504b, and a bypass block 506. In some embodiments, a trigger-bypass block 504 may be used in lieu of a bypass block 506 by leaving the inverter unconnected. In some embodiments, a trigger-bypass block 504 may be used in lieu of a trigger block 502 by leaving the latch and PFET unconnected. Accordingly, a trigger-bypass block 504 may be regarded as a "universal" block that may be used as any one of the three types of supplemental circuit blocks.

The embodiment shown in FIG. 5 replaces the trigger-bypass blocks 404a, 404b and the bypass block 406 with modified trigger-bypass blocks 504a, 504b and a modified bypass block 506. In essence, the cross-coupled PFETs M2Pb-MP4b shown in FIG. 4A are replaced by a circuit that essentially functions as an active-low set/reset (SR) latch 501a-501c.

The SR latch 501x of each modified trigger-bypass block 504x and modified bypass block 506 has an output Q coupled to the gate of a respective PFET MP2a-MP4a. The $\overline{R}$ (low Reset) input of the SR latch 501x of each such supplemental circuit block is coupled to the respective Trigger signal line from an adjacent lower tier supplemental circuit block. For example, within modified bypass block 506, the $\overline{R}$ input of the SR latch 501c coupled to MP4a is coupled to the Trigger signal line from trigger NFET MNt3 within modified trigger-bypass block 504a. The $\overline{R}$ input of the SR latch 501x of each such supplemental circuit block is also coupled by a pull-up resistor $R_P$ to the top plate of a respective bootstrap capacitor C2-C4.

The $\overline{S}$ (low Set) input of the SR latch 501x of each modified trigger-bypass block 504x and modified bypass block 506 is coupled to a respective control signal VG1'-VG3' corresponding to a respective gate control signal VG1-VG3 applied to the NFET power switch of the adjacent lower tier. The control signals VG1'-VG3' are synchronous with the gate control signals VG1-VG3 but differ from the gate control signals VG1-VG3 in phase and may be level-shifted. Preferably, the control signals VG1'-VG3' are earlier in phase than the gate control signals VG1-VG3 so as to switch the output Q of their respective SR latch 501x (in order to turn the respective PFET MP2a-MP4a OFF) before the respective NFET power switch MN1-MN3 turns OFF. The delay in the gate control signals VG1-VG3 relative to the control signals VG1'-VG3' may be provided, for example, by the signal delay intrinsic to the driver circuit for the corresponding NFET power switch MNx.

In operation, adjacent supplemental circuit blocks 502, 504x, 506 work in pairs. The upper block of the pair functions, when triggered, to charge an associated bootstrap capacitor by connecting the top plate of its associated bootstrap capacitor to the top plate of the bootstrap capacitor associated with the lower block of the pair, essentially bypassing the diode associated with the upper block. In addition, the lower block of the pair functions to initiate (Trigger) the bypass function of the upper block.

Thus, for example, while gate control voltage VG2 is applied to NFET power switch MN2, then MN2 turns ON, thereby connecting the bottom plate of bootstrap capacitor C2 to the bottom plate of bootstrap capacitor C3. Accordingly, charge begins to transfer from the top plate of C2 through diode D2' to the top plate of C3. In the meantime, the ON state of MN2 causes the input of inverter I2 to be low, thus causing the output of inverter I2 to be high, in turn causing trigger NFET MNt2 to turn ON. The conductive state of trigger NFET MNt2 connects the R input of the SR latch 501b a low potential, and thus acts as a Trigger signal that causes the Q output of SR latch 501b to be low (negative with respect to the source of PFET MP3a). Accordingly, MP3a conducts some delay time after MN2 turns ON. When MP3a conducts, it effectively bypasses diode D2' and connects the top plate of C3 directly to the top plate of C2, imposing essentially no voltage drop penalty with respect to charge transfer from C2 to C3.

In the embodiments of FIGS. 4A and 4B, the difference in top plate voltages of two previously-connected bootstrap capacitors as they "fly" apart (due to an associated NFET power switch MNx switching to an OFF state) is used to terminate the bypass function of a trigger-bypass block 404x or a bypass block 406. In contrast, in the embodiment of FIG. 5, a respective "early" control signal VG1'-VG3' is applied to the $\overline{S}$ input of an associated SR latch 501x, causing the Q output of SR latch 501b to be high, thus turning the associated PFET MP2a-MP4a OFF and terminating the bypass function of a modified trigger-bypass block 504x or a modified bypass block 506. Since the high-to-low state changes of the control signals VG1'-VG3' preferably occur earlier in time (but otherwise synchronously with) than the corresponding high-to-low state changes of the gate control signals VG1-VG3, an initiated bypass function terminates before the voltages of the associated bootstrap capacitors (e.g., C2 and C3) can "fly" apart. Accordingly, the diode bypass function of the PFETs MP2a-MP4a terminates sufficiently early to avoid the possibility that PFETs MP2a-MP4a might be inadvertently activated or stay activated too long.

Self-Timed Setting/Controlled Re-Setting Supplemental Circuits Utilizing Intrinsic Body Diodes Like the embodiment of FIG. 4A, the embodiment of FIG. 5 utilizes explicit circuit component diodes D1'-D3'. However, in some applications, the explicit diodes D1'-D3' may be omitted, instead relying upon the intrinsic body diode of a MOSFET device to perform essentially the same function, as in the example of FIG. 4B. Thus, the intrinsic body diodes of PFETs MP2a-MP4a in the embodiment of FIG. 5 may be used in lieu of explicit diodes D1'-D3'. Again, level shifter circuitry is omitted in this example but may be needed in some embodiments, depending on the value of V and the number of tiers in a multi-level power converter.

Extension to Other Multi-Level Power Converters

Figure 1:
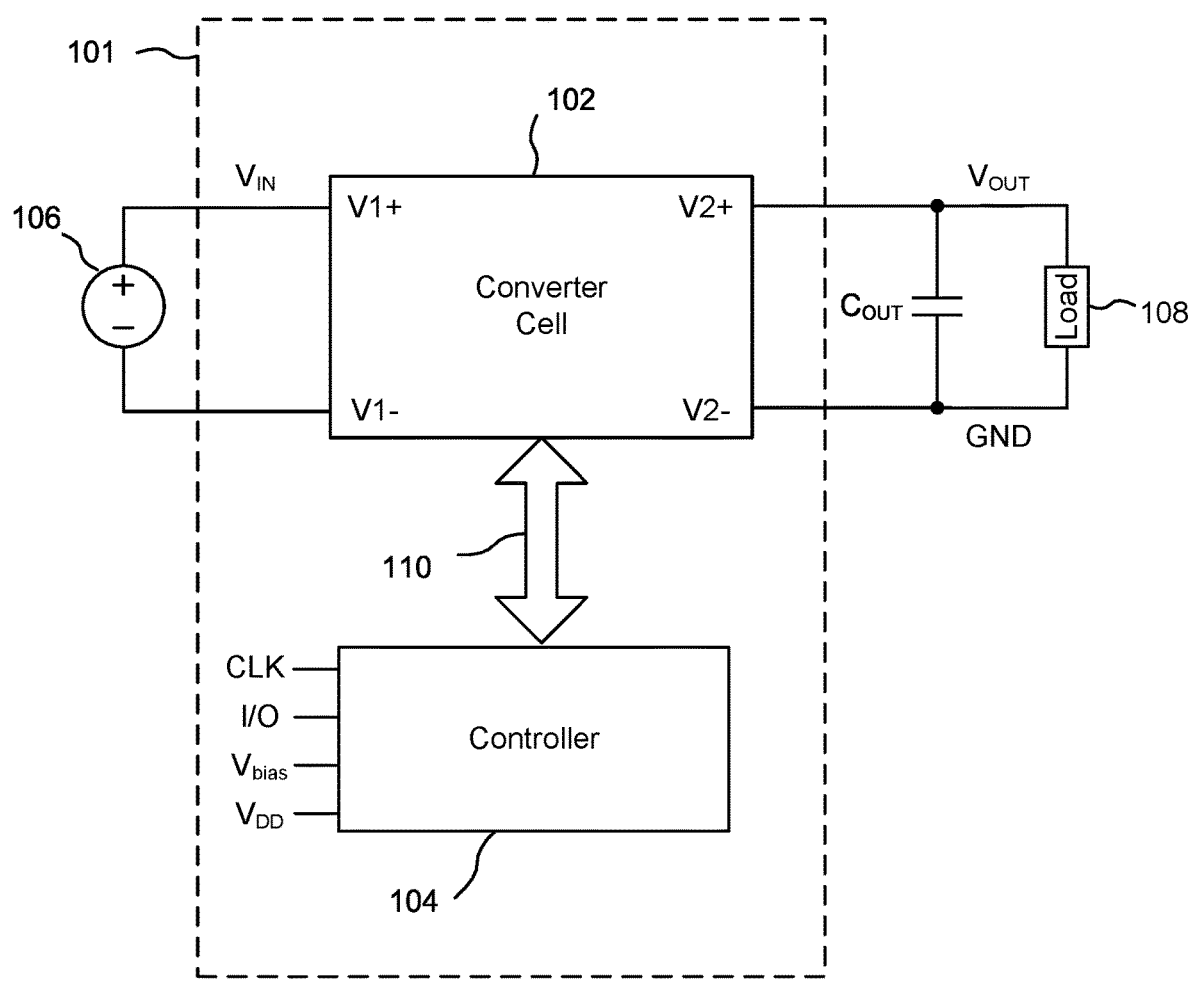
FIG. 1 is a block diagram of a circuit that includes a prior art power converter.
Figure 2:
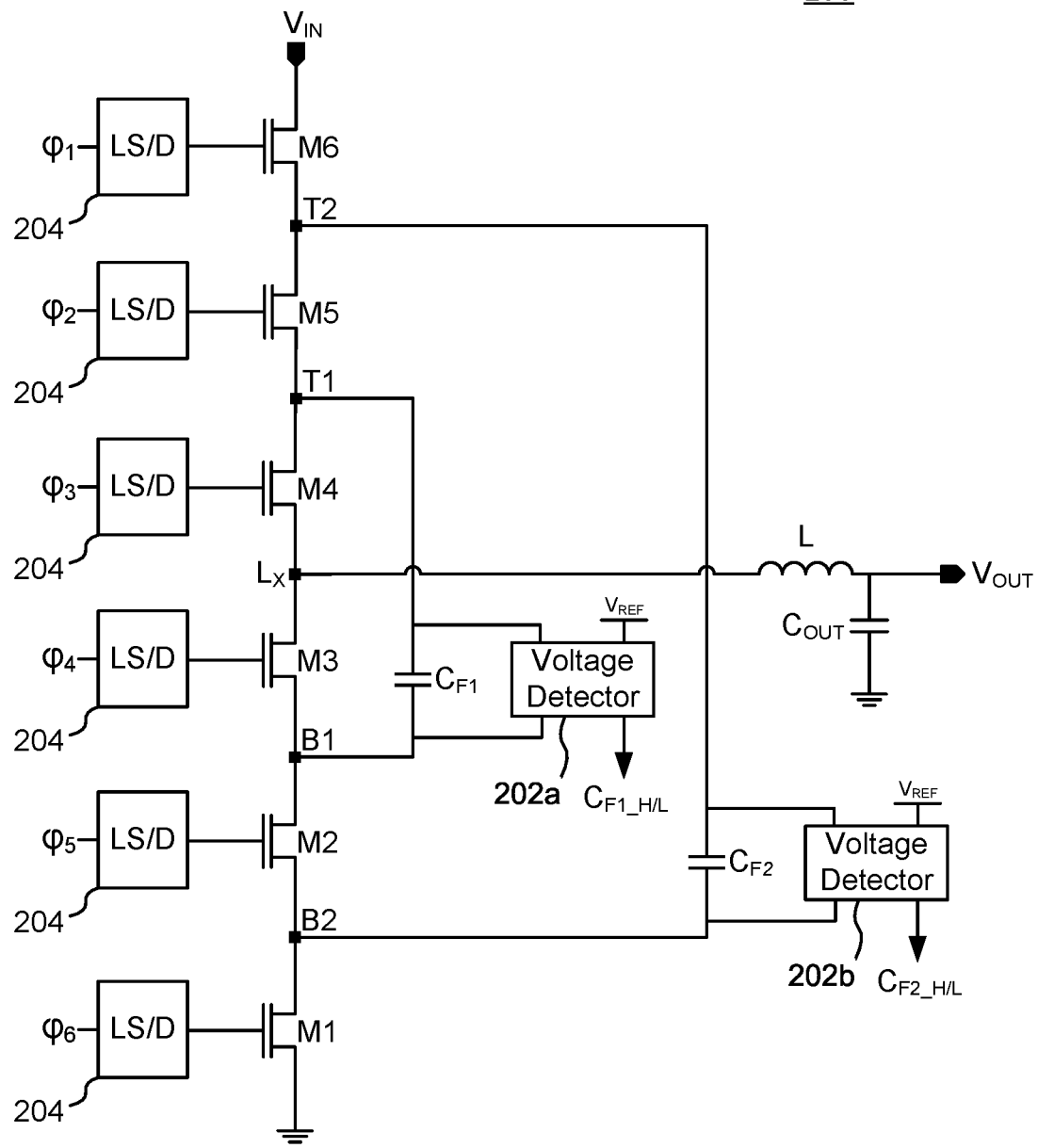
FIG. 2 is a schematic diagram of a prior art 4-level DC-to-DC buck converter circuit that may be used as the converter circuit of FIG. 1.
Figure 6A:
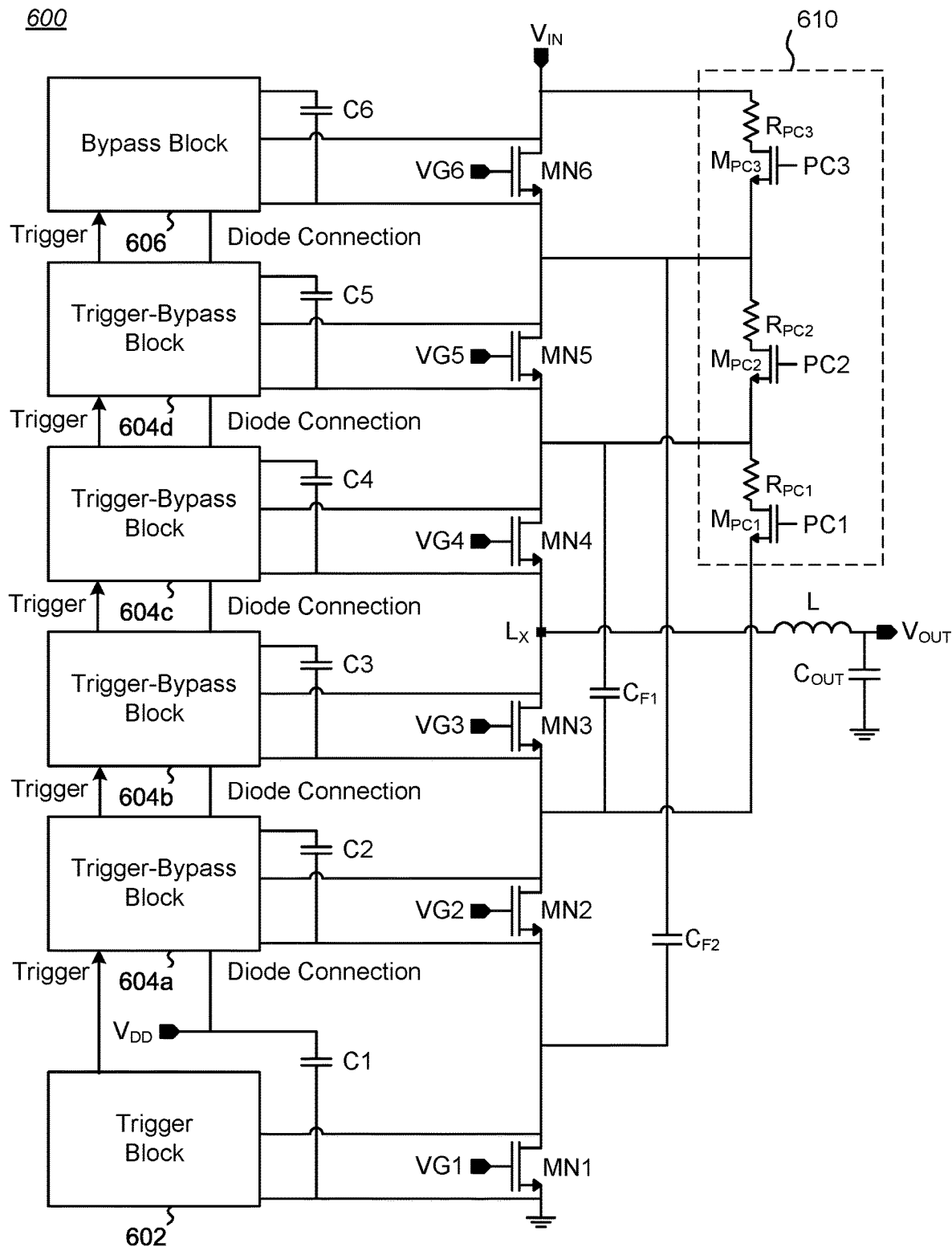
FIG. 6A is a block diagram of a 4-level multi-level power converter that includes supplemental circuits in accordance with the present invention.

While FIGS. 4A, 4B, and 5 show example 3-level multi-level power converters, the concepts of the present invention can readily be extended to higher order multi-level power converters and to other types of power converters. For example, FIG. 6A is a block diagram 600 of a 4-level multi-level power converter that includes supplemental circuits in accordance with the present invention. Similar in most respects to the embodiments of FIGS. 4A, 4B, and 5, the supplemental circuit blocks 402, 502, 404x, 504x, and 406, 406 of those figures have been generalized to a trigger block 602, trigger-bypass blocks 604a-604d, and a bypass block 606. The number of NFET power switches MNx totals 6 (as in the 4-level multi-level power converter of FIG. 2). In FIG. 6A, the stack of diodes shown in FIGS. 4A and 5 is considered to be part of the supplemental circuit blocks, since explicit circuit component diodes are optional.

Additional circuitry may be added as desired for particular applications. For example, the voltage detectors 202a, 202b shown in FIG. 2 may be included in the embodiments shown in FIGS. 4A, 4B, 5, and 6 and in higher-order multi-level power converters. As another example, it may be necessary to pre-charge the bootstrap capacitors Cx during a startup period before normal switched operation of the power converter can properly begin. Shown in FIG. 6A is one example of a pre-charge circuit 610 that may be used during a startup period. As illustrated, a first NFET $M_{PC1}$ and associated series resistor $R_{PC1}$ are coupled between the bottom plates of bootstrap capacitors C3 and C5; a second NFET $M_{PC2}$ and associated series resistor $R_{PC2}$ are coupled between the bottom plates of bootstrap capacitors C5 and C6; and a third NFET $M_{PC3}$ and associated series resistor $R_{PC3}$ are coupled between the bottom plate of bootstrap capacitor C6 and $V_{IN}$.

In one start-up process, at the beginning of the start-up period, the bottom two NFET power switches MN1, MN2 are forced to turn ON (i.e., VG1 and VG2 are high) to connect the bottom plates of the two fly capacitors $C_{F1}$, $C_{F2}$ to circuit ground, and $V_{DD}$ is applied to bootstrap capacitor C1. Switches MN3 to MN6 remains OFF. If the fly capacitors $C_{F1}$, $C_{F2}$ are initially in a discharged state and the capacitance of the fly capacitors $C_{F1}$, $C_{F2}$ is much larger than the capacitance of the bootstrap capacitors Cx, then the diodes (explicit or intrinsic) within the trigger-bypass blocks 604a, 604b and the corresponding bypass PFETs MPna when ON charges the bottom three bootstrap capacitors C1-C3, while only the diodes within the trigger-bypass blocks 604c, 604d and bypass block 606 charges the top three bootstrap capacitors C4-C6.

Then, using NFETs $M_{PC1}$-$M_{PC3}$ in conjunction with their respective series resistors $R_{PC1}$-$R_{PC3}$, fly capacitors $C_{F1}$, $C_{F2}$ can be pre-charged to respective target voltages by turning the three NFETs $M_{PC1}$-$M_{PC3}$ ON or OFF until the respective target voltage is reached (for example, as determined by a voltage detector 202a, 202b). For example, if the $C_{F1}$ voltage is above target, then $M_{PC1}$ should be turned ON. If the $C_{F1}$ voltage is below target or the $C_{F2}$ voltage is above target, then $M_{PC2}$ should be turned ON. If the $C_{F2}$ voltage is below target, then $M_{PC3}$ should be turned ON. In this example, the respective target voltages are $V_{IN}/3$ for fly capacitor $C_{F1}$ and $2 \times V_{IN}/3$ for fly capacitor $C_{F2}$ (the denominator is one less than the order or level of the multi-level power converter: 3=level 4−1 in this instance). Once fly capacitors $C_{F1}$, $C_{F2}$ reach their target voltages, normal switching of the power converter at a target switching frequency can begin.

As the voltage on fly capacitors $C_{F1}$, $C_{F2}$ rises, the diodes within the trigger-bypass blocks 604c and 604d and within the bypass block 606 stops charging the top three bootstrap capacitors C4-C6. Leakage currents from the circuits connected to the top three bootstrap capacitors C4-C6 may cause those capacitors to discharge, in which case the capacitor charge can be replenished by periodically turning ON NFET power switches MN3, MN4, and MN5 for a short time (e.g., 100 ns), which forces a small current through the inductor L to the output of the power converter.

As should be appreciated, other circuitry may be used to pre-charge the fly capacitors and bootstrap capacitors of a multi-level power converter.

Figure 6B:
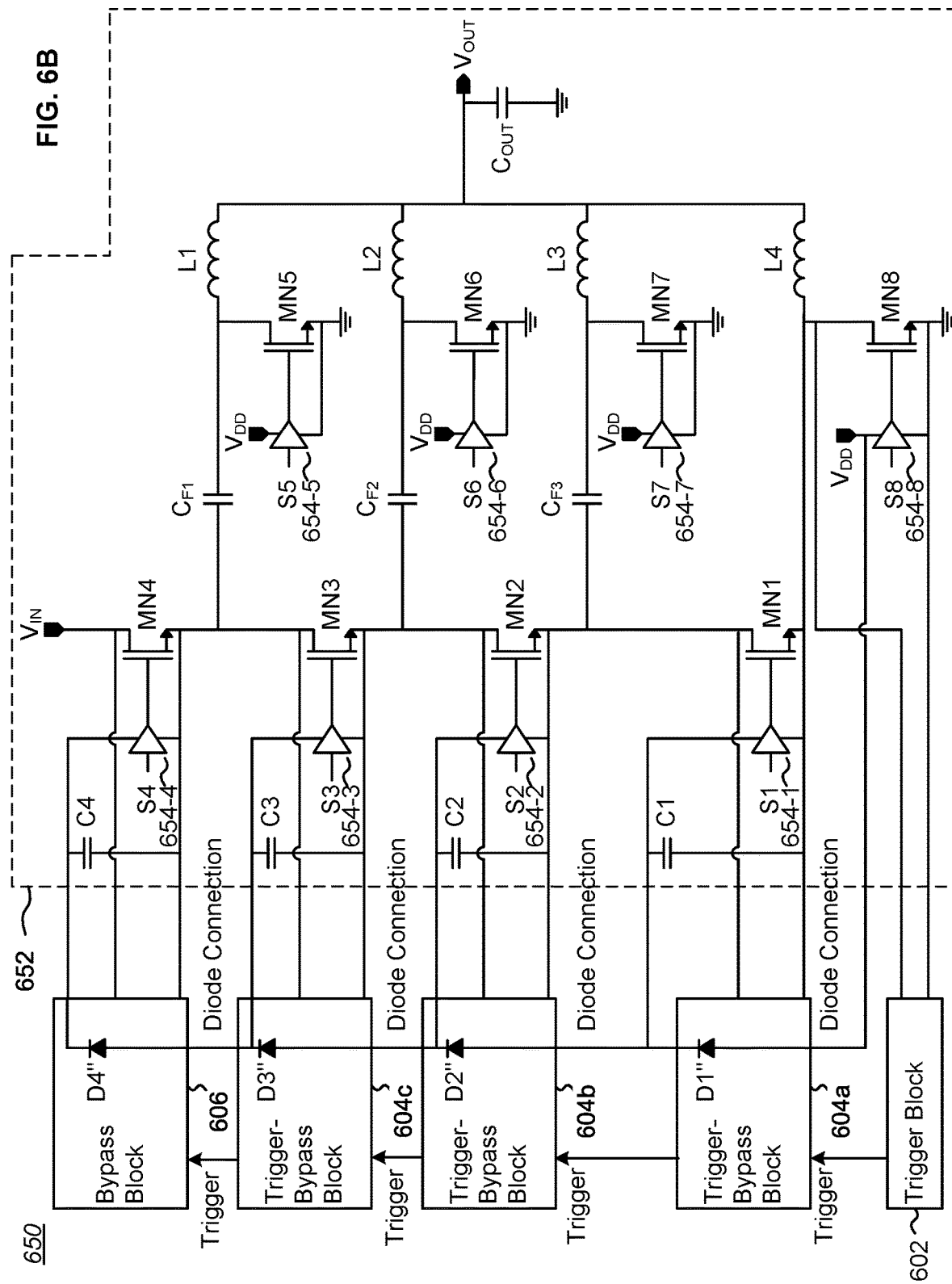
FIG. 6B is a block diagram of a series capacitor buck power converter that includes supplemental circuits in accordance with the present invention.

As another example of usage of the inventive charging circuits for bootstrap capacitors with other types of power converters, FIG. 6B is a block diagram 650 of a series capacitor buck power converter 652 that includes supplemental circuits in accordance with the present invention. The series capacitor buck power converter 652 includes a first set of series-coupled NFET power switches MN1-MN4 and a second set of series-coupled NFET power switches MN5-MN8. Each NFET power switch MN1-MN8 has a control gate coupled to a respective driver circuit 654-1 . . . 654-8 (e.g., a buffer circuit), which in turn is coupled to a respective control signal S1-S8. In the illustrated example, the drains and sources of three corresponding pairs of NFET power switches from the two sets are coupled by a capacitor; thus, fly capacitor $C_{F1}$ couples the source of MN4 to the drain of MN5, fly capacitor $C_{F2}$ couples the source of MN3 to the drain of MN6, and fly capacitor $C_{F3}$ couples the source of MN2 to the drain of MN7. The respective drain of each of the second set of NFET power switches MN5-MN8 is coupled through a corresponding inductor L1-L4 to the $V_{OUT}$ terminal and an output capacitor $C_{OUT}$.

In the illustrated example, the second set of series-coupled NFET power switches MN5-MN8 is powered by $V_{DD}$, while the first set of series-coupled NFET power switches MN5-MN1-MN4 are powered by respective bootstrap capacitors C1-C4. In a conventional configuration, diodes D1"-D4" are coupled as shown between either $V_{DD}$ and the top plate of C1 (in the case of D1"), or between the top plate of an associated bootstrap capacitor and the top plate of the bootstrap capacitor associated with the next lower block bootstrap capacitor. Thus, D2" couples the top plates of C2 and C1, D3" couples the top plates of C3 and C2, and D5" couples the top plates of C4 and C3. The series capacitor buck power converter 652 operates in known fashion.

A conventional series capacitor buck power converter 652 poses the problems noted above regarding charging the bootstrap capacitors C1-C4 effectively, efficiently, and with minimal circuitry. However, in the example shown in FIG. 6B, a trigger block 602 is coupled across NFET power switch MN8, trigger-bypass blocks 604a, 604b, 604c are respectively coupled to bootstrap capacitors C1, C2, C3, and a bypass block 606 is coupled to bootstrap capacitor C4 (note that in FIG. 6B, the stack of diodes D1"-D4" are shown as part of the supplemental circuit blocks, since explicit circuit component diodes are optional). Accordingly, the conventional series capacitor buck power converter 652 benefits from use of the supplemental blocks encompassed by the present invention.

Figure 6C:
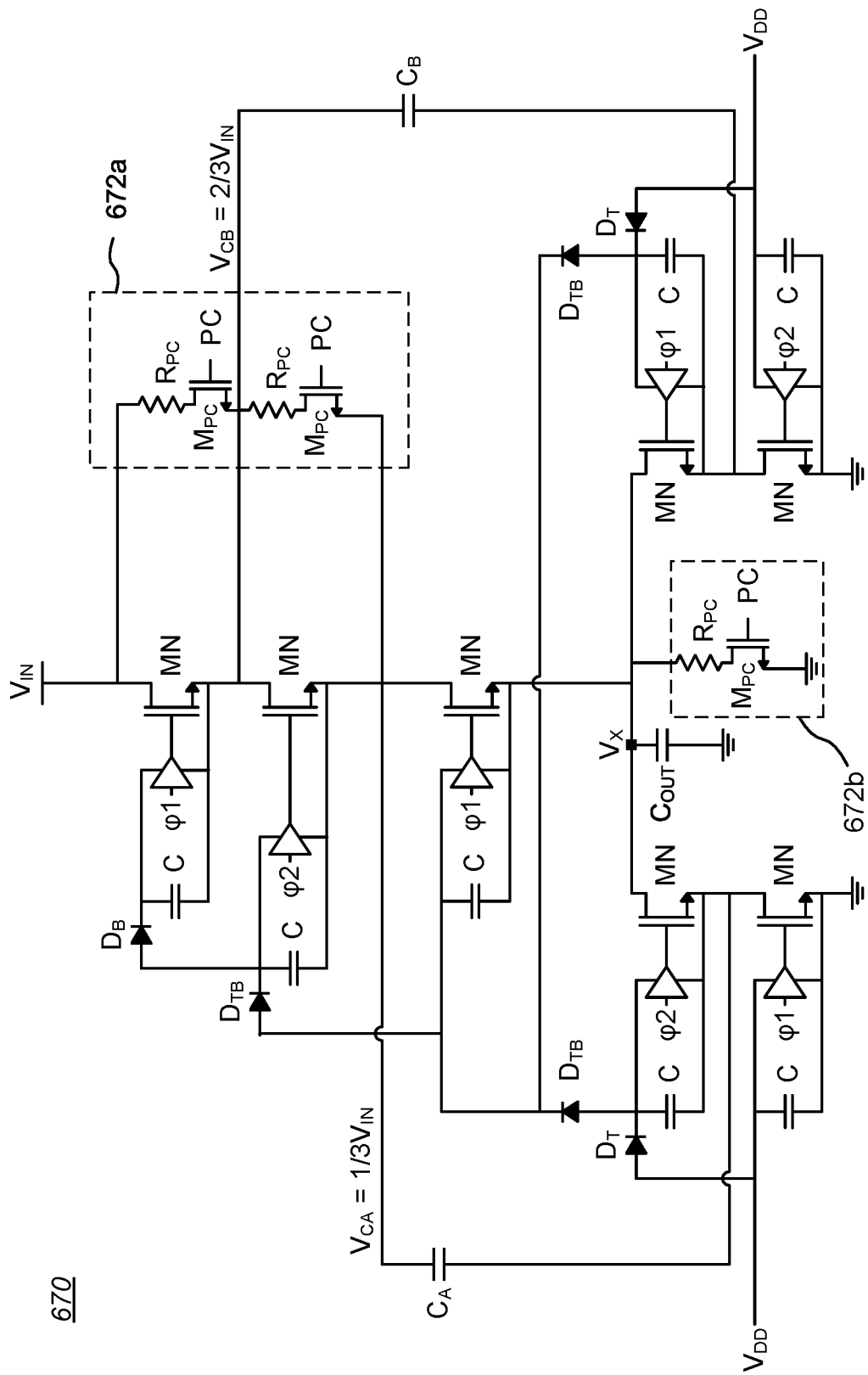
FIG. 6C is a block diagram of a conventional charge pump power converter.

As yet another example of usage of the inventive charging circuits for bootstrap capacitors with other types of power converters, FIG. 6C is a block diagram of a conventional charge pump power converter 670. In the illustrated example, during clock phase φ1, capacitor $C_B$ charges and capacitor $C_A$ discharges. Conversely, during clock phase φ2, capacitor $C_B$ discharges and capacitor $C_A$ charges. In order to beneficially use supplemental circuits in accordance with the present invention so as to ripple charge from $V_{DD}$ upwards to charge each bootstrap capacitor C, the diodes Dx would be replaced by one of a trigger block (for the bottom-most diodes $D_T$), a bypass block (for the top-most diode $D_B$), or trigger-bypass blocks (for the intermediate diodes D B).

The conventional charge pump power converter 670 may also include pre-charge circuits 672a, 672b that function in a manner similar to the pre-charge circuit 610 of FIG. 6A to precharge the bootstrap capacitors C during a startup period before normal switched operation of the power converter can properly begin.

Example Control Circuitry for an M-Level Converter Cell

It should be appreciated that a power converter may require a sophisticated control circuit, which may include a feedback loop, in order to control switching of the power FETs and monitor currents and/or voltages at one or more nodes of the power converter in order to achieve desired conversion ratios and maintain desired output voltage levels.

Figure 7:
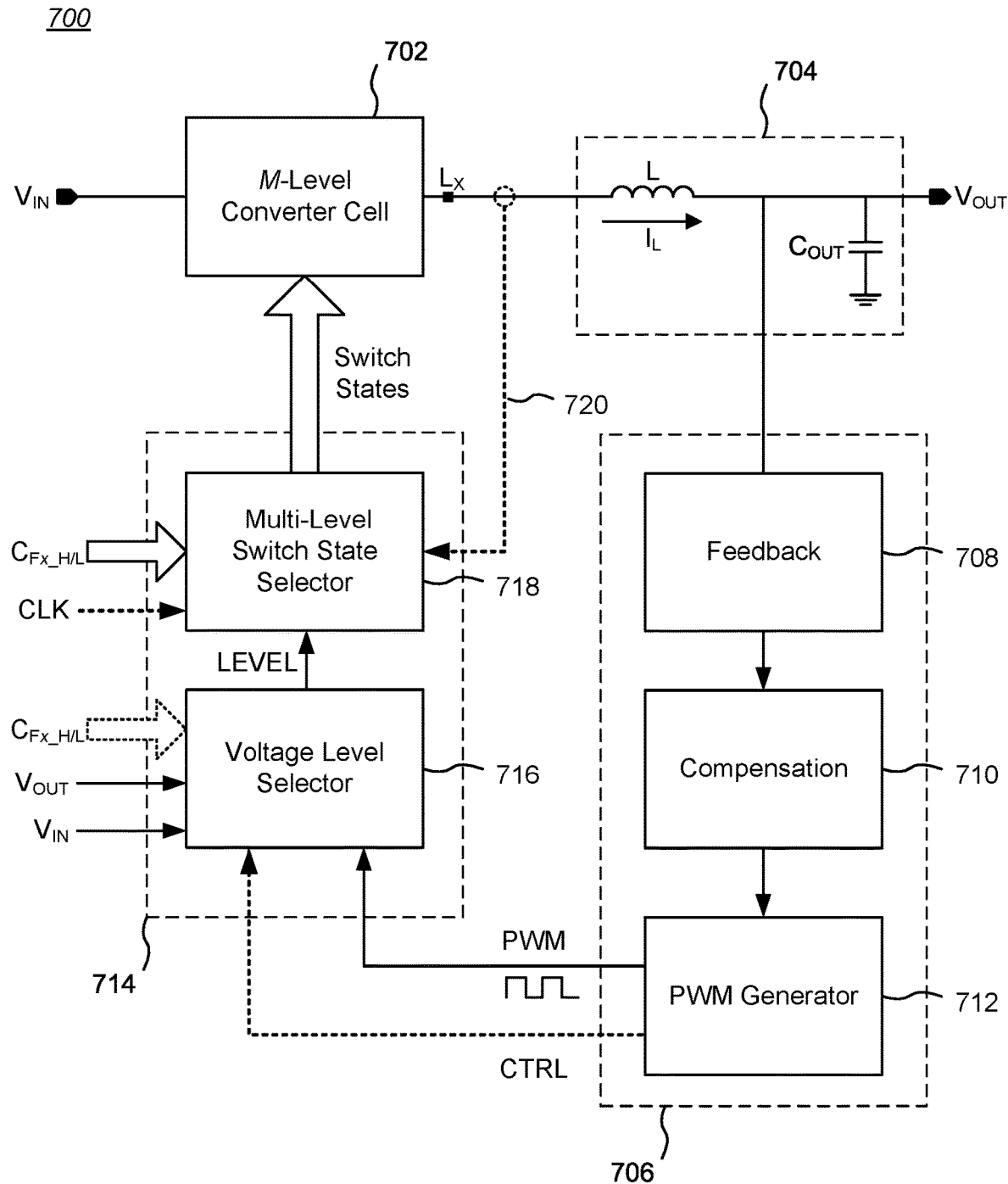
FIG. 7 is a block diagram of one embodiment of control circuitry for an M-level converter cell coupled to an output block comprising an inductor L and an output capacitor $C_{OUT}$.

For example, FIG. 7 is a block diagram of one embodiment of control circuitry 700 for an M-level converter cell 702 coupled to an output block 704 comprising an inductor L and an output capacitor $C_{OUT}$ (conceptually, the inductor L also may be considered as being included within the M-level converter cell 400). This example control circuitry 700 is adapted from the teachings set forth in U.S. Patent Application Ser. No. 63/276,923, filed Nov. 8, 2021, entitled "Controlling Charge-Balance and Transients in a Multi-Level Power Converter", assigned to the assignee of the present invention, the contents of which are incorporated by reference. However, the present invention may be used in combination with other types of control circuitry for an M-level converter cell 702.

The control circuitry 700 functions as a control loop coupled to the output of the M-level converter cell 702 and to switch control inputs of the M-level converter cell 702. In general, the control circuitry 700 is configured to monitor the output (e.g., voltage and/or current) of the M-level converter cell 702 and dynamically generate a set of switch control inputs to the M-level converter cell 702 that attempt to stabilize the output voltage and/or current at specified values, taking into account variations of $V_{IN}$ and output load. In alternative embodiments, the control circuitry 700 may be configured to monitor the input of the M-level converter cell 702 (e.g., voltage and/or current) and/or an internal node of the M-level converter cell 702 (e.g., the voltage across one or more fly capacitors or the current through one or more power switches). Accordingly, most generally, the control circuitry 700 may be configured to monitor the voltage and/or current of a node (e.g., input terminal, internal node, or output terminal) of the M-level converter cell 702. The control circuitry 700 may be incorporated into, or may be separate from, the overall controller 104 for a power converter 100 embodying the M-level converter cell 702.

A first block comprises a feedback controller 706, which may be a traditional controller such as a fixed frequency voltage mode or current mode controller, a constant-on-time controller, a hysteretic controller, or any other variant. The feedback controller 706 is shown as being coupled to $V_{OUT}$ from the M-level converter cell 702. In alternative embodiments, the feedback controller 706 may be configured to monitor the input of the M-level converter cell 702 and/or an internal node of the M-level converter cell 702. The feedback controller 706 produces a signal directly or indirectly indicative of the voltage at $V_{OUT}$ that determines in general terms what needs to be done in the M-level converter cell 702 to maintain desired values for $V_{OUT}$: charge, discharge, or tristate (i.e., open, with no current flow).

In the illustrated example, the feedback controller 706 includes a feedback circuit 708, a compensation circuit 710, and a PWM generator 712. The feedback circuit 708 may include, for example, a feedback-loop voltage detector which compares $V_{OUT}$ (or an attenuated version of $V_{OUT}$) to a reference voltage which represents a desired $V_{OUT}$ target voltage (which may be dynamic) and outputs a control signal to indicate whether $V_{OUT}$ is above or below the target voltage. The feedback-loop voltage detector may be implemented with a comparison device, such as an operational amplifier (op-amp) or transconductance amplifier (gm amplifier).

The compensation circuit 710 is configured to stabilize the closed-loop response of the feedback controller 706 by avoiding the unintentional creation of positive feedback, which may cause oscillation, and by controlling overshoot and ringing in the step response of the feedback controller 706. The compensation circuit 710 may be implemented in known manner, and may include LC and/or RC circuits.

The PWM generator 712 generates the actual PWM control signal which ultimately sets the duty cycle of the switches of the M-level converter cell 702. In some embodiments, the PWM generator 712 may pass on additional optional control signals CTRL indicating, for example, the magnitude of the difference between $V_{OUT}$ and the reference voltage (thus indicating that some levels of the M-level converter cell 702 should be bypassed to get to higher or lower levels), and the direction of that difference (e.g., $V_{OUT}$ being greater than or less than the reference voltage). In other embodiments, the optional control signals CTRL can be derived from the output of the compensation circuit 710, or from the output of the feedback circuit 708, or from a separate comparator (not shown) coupled to, for example, $V_{OUT}$. One purpose of the optional control signals CTRL is for advanced control algorithms, when it may be beneficial to know how far away $V_{OUT}$ is from a target output voltage, thus allowing faster charging of the inductor L if the $V_{OUT}$ is severely under regulated.

A second block comprises an M-level controller 714, the primary function of which is to select the switch states that generate a desired $V_{OUT}$ while maintaining a charge-balance state on the fly capacitors within the M-level converter cell 702 every time an output voltage level is selected, regardless of what switch state or states were used in the past.

The M-level controller 714 includes a Voltage Level Selector 716 which receives the PWM control signal and the additional control signals CTRL if available. In addition, the Voltage Level Selector 716 may be coupled to $V_{OUT}$ and/or $V_{IN}$, and, in some embodiments, to HIGH/LOW status signals, $C_{Fx\_H/L}$, from voltage detectors coupled to corresponding fly capacitors $C_{Fx}$ within the M-level converter cell 702. A function of the Voltage Level Selector 716 is to translate the received signals to a target output voltage level (e.g., on a cycle-by-cycle basis). The Voltage Level Selector 716 typically considers at least $V_{OUT}$ and $V_{IN}$ to determine which target level should charge or discharge the output of the M-level converter cell 702 with a desired rate.

The output of the Voltage Level Selector 716 is coupled to an M-level Switch State Selector 718, which generally would be coupled to the status signals, $C_{Fx\_H/L}$, from the capacitor voltage detectors for the fly capacitors $C_{Fx}$. Taking into account the target level generated by the Voltage Level Selector 716, the M-level Switch State Selector 718 determines which switch state for the desired output level should be best for capacitor charge-balance. The M-level Switch State Selector 718 may be implemented, for example, as a look-up table (LUT) or as comparison circuitry and combinatorial logic or more generalized processor circuitry. The output of the M-level Switch State Selector 718 is coupled to the switches of the M-level converter cell 702 (through appropriate level-shifter circuits and drivers circuits, as may be needed for a particular converter cell) and includes the switch state settings determined by the M-level Switch State Selector 718 (which selects the configuration of switches within the M-level converter cell 702 corresponding to a selected target level).

In general (but not always), the Voltage Level Selector 716 and the M-level Switch State Selector 718 only change their states when the PWM signal changes. For example, when the PWM signal goes high, the Voltage Level Selector 716 selects which level results in charging of the inductor L and the M-level Switch State Selector 718 sets which version to use of that level. Then when the PWM signal goes low, the Voltage Level Selector 716 selects which level should discharge the inductor L and the M-level Switch State Selector 718 sets which version of that level to use. Thus, the PWM signal is in effect the clock signal for the Voltage Level Selector 716 and the M-level Switch State Selector 718. However, there may be situations or events where it is desirable for the CTRL signals to change the state of the Voltage Level Selector 716. Further, there may be situations or events where it is desirable for the $C_{Fx\_H/L}$ status signal(s) from voltage detectors coupled to the fly capacitors $C_{Fx}$ within the M-level converter cell 702 to cause the M-level Switch State Selector 718 to select a particular configuration of power switch settings, such as when a severe mid-cycle imbalance occurs. In some embodiments, it may be useful to include a timing function that forces the M-level Switch State Selector 718 to re-evaluate the optimal version of the state periodically, for example, in order to avoid being "stuck" at one level for a very long time, potentially causing charge imbalances.

In embodiments that utilize the teachings set forth in the patent application entitled "Controlling Charge-Balance and Transients in a Multi-Level Power Converter" referenced above, the M-level controller 714 implements a control method for the M-level converter cell 702 that selects an essentially optimal switch state which moves the fly capacitors $C_{Fx}$ towards a charge-balance state every time a voltage level at the $L_X$ node is selected, regardless of what switch state or states were used in the past. Accordingly, such multi-level converter circuits are free to select a different switch state or $L_X$ voltage level every switching cycle without a need to keep track of any prior switch state or sequence of switch states.

One notable benefit of the control circuitry shown in FIG. 7 is that it enables generation of voltages in boundary zones between voltage levels, which represent unattainable output voltages for conventional multi-level DC-to-DC converter circuits.

In alternative unregulated charge-pumps embodiments, the feedback controller 706 and the Voltage Level Selector 716 may be omitted, and instead a clock signal CLK may be applied to the M-level Switch State Selector 718. The M-level Switch State Selector 718 would generate a pattern of switch state settings that periodically charge balances the fly capacitors $C_{Fx}$ regardless of what switch state or states were used in the past (as opposed to cycling through a pre-defined sequency of states). This ensures that if $V_{IN}$ changes or anomalous evens occur, the system generally always seeks charge balance for the fly capacitors $C_{Fx}$.

In some embodiments, the M-level Switch State Selector 718 may take into account the current $I_L$ flowing through the inductor L by way of an optional current-measurement input 720, which may be implemented in conventional fashion.

While FIG. 7 shows a particular embodiment of control circuitry for an M-level converter cell as modified in accordance with the present invention, it should be appreciated that other control circuits may be adapted or devised to provide suitable switching signals for the switches within a converter cell.

Circuit Embodiments

In power converters, particularly multi-level power converters, the power switches may be implemented with FETs, especially MOSFETs. For each power FET, a driver circuit is generally required. In addition, for some power FETs, a level shifter may be required to translate ground-referenced low-voltage logic ON/OFF signals from an analog or digital controller into a signal with the same voltage swing but referenced to the source voltage of the power FET that the signal is driving in order to charge or discharge the gate of the power FET and thereby control the conducting or blocking state of the power FET. In some applications, the functions of a level shifter and a driver circuit may be incorporated into one circuit.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 8:
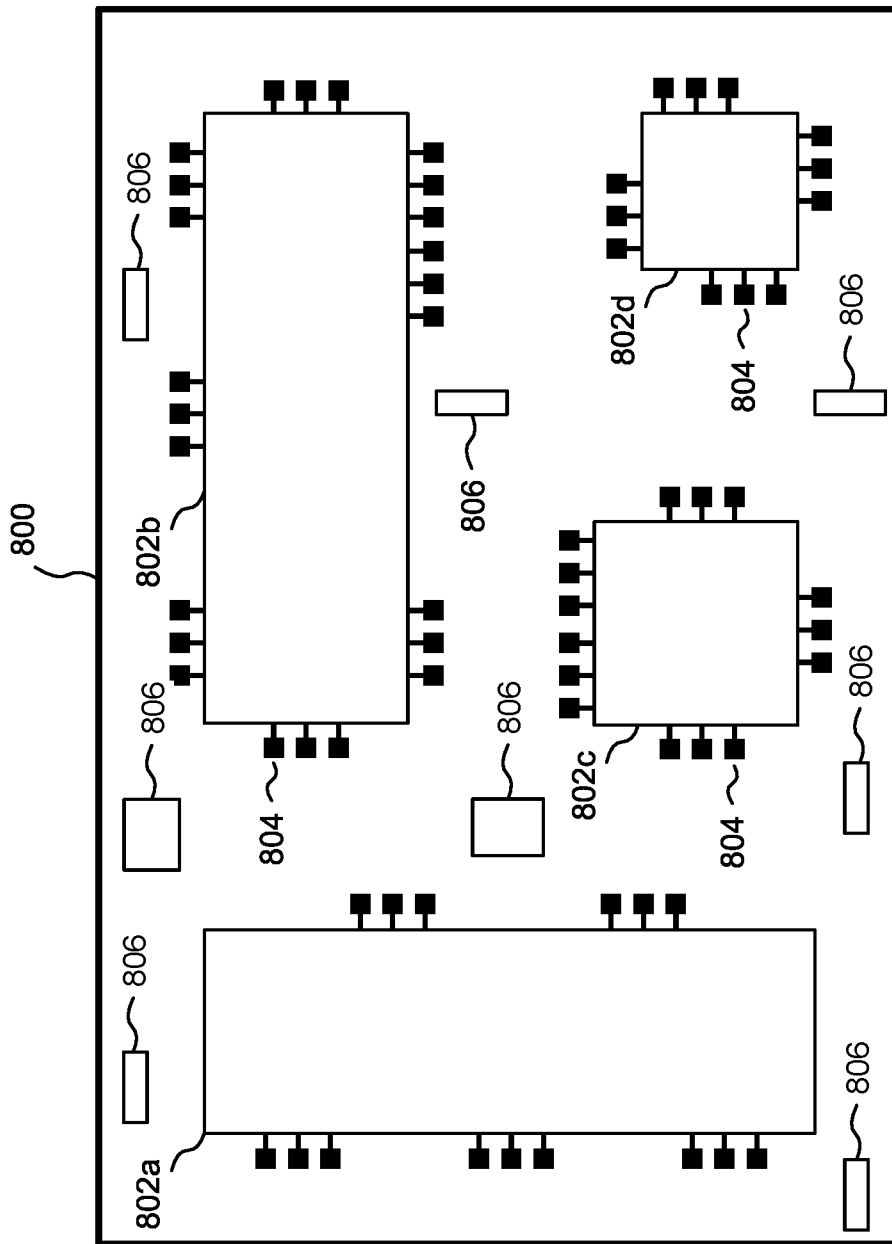
FIG. 8 is a top plan view of a substrate that may be, for example, a printed circuit board or chip module substrate (e.g., a thin-film tile).

As one example of further integration of embodiments of the present invention with other components, FIG. 8 is a top plan view of a substrate 800 that may be, for example, a printed circuit board or chip module substrate (e.g., a thin-film tile). In the illustrated example, the substrate 800 includes multiple ICs 802a-802d having terminal pads 804 which would be interconnected by conductive vias and/or traces on and/or within the substrate 800 or on the opposite (back) surface of the substrate 800 (to avoid clutter, the surface conductive traces are not shown and not all terminal pads are labelled). The ICs 802a-802d may embody, for example, signal switches, active filters, amplifiers (including one or more LNAs), and other circuitry. For example, IC 802b may incorporate one or more instances of a power converter circuit that includes embodiments of the circuits shown in FIGS. 4A, 4B, 5, and/or 6.

The substrate 800 may also include one or more passive devices 806 embedded in, formed on, and/or affixed to the substrate 800. While shown as generic rectangles, the passive devices 806 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 800 to other passive devices 806 and/or the individual ICs 802a-802d. The front or back surface of the substrate 800 may be used as a location for the formation of other structures.

Additional Control and Operational Considerations

It may be desirable to provide additional control and operational circuitry (or one or more shutdown procedures) that enables reliable and efficient operation of a power converter utilizing a multi-level converter cell designed in accordance with the present disclosure. For example, in a step-down power converter, the output voltage of a converter cell is less than the input voltage of the converter cell. Shutting down or disabling (e.g., because of a fault event, such as a short) a converter cell having a designed-in inductance connected to the output while the output load current is non-zero generally requires some means for discharging the inductor current. In some embodiments, a bypass switch may be connected in parallel with a designed-in inductance connected to the output of a converter cell and controlled to be open during normal operation and closed when shutting down the converter cell or if a fault event occurs. Ideally, in order to prevent transient ringing and to provide safe discharge of the inductor current, the bypass switch can be closed before disabling converter cell switching. In alternative embodiments using MOSFETs for the main switches of the converter, the inherent body diode connected between the body and drain terminals of each MOSFET can also discharge the inductor current. Details of these solutions, as well as alternative shutdown solutions, are taught in U.S. Pat. No. 10,686,367, issued Jun. 16, 2020, entitled "Apparatus and Method for Efficient Shutdown of Adiabatic Charge Pumps", assigned to the assignee of the present invention, the contents of which are incorporated by reference.

Another consideration when combining converter cells in parallel is controlling multiple parallel power converters in order to avoid in-rush current (e.g., during a soft-start period for the power converters) and/or switch over-stress if all of the power converters are not fully operational, such as during startup or when a fault condition occurs. Conditional control may be accomplished by using node status detectors coupled to selected nodes within parallel-connected power converters to monitor voltage and/or current. Such node status detectors may be configured in some embodiments to work in parallel with an output status detector measuring the output voltage of an associated power converter during startup. The node status detectors ensure that voltages across important components (e.g., fly capacitors and/or switches) within the converter cell(s) of the power converters are within desired ranges before enabling full power steady-state operation of the parallel power converters, and otherwise prevent full power steady-state operation. The node status detectors may be coupled to a master controller that controls one or more of the parallel power converters using one or more common control signals. In furtherance of a master controller configuration, the parallel power converters may each report a power good signal (Pgood) when ready to leave a startup phase for full power steady-state operation. The master controller may essentially "AND" all such Pgood signals together, possibly along with one or more status signals from other circuits, such that the master controller does not enable full power steady-state operation of any the parallel power converter unless all of the parallel power converters are ready for that state. In essence, the Pgood signals from each parallel power converter are all tied together such that the parallel power converters may not transition out of startup phase until all the Pgood signals indicate that they are ready to transition to steady operation. Furthermore, if the Pgood signal changes due to a fault condition in one or more of the parallel power converters, the parallel power converters can transition from a steady state operation to an auto-restart or shutdown operation. Details of these solutions, as well as alternative shutdown solutions, are taught in U.S. Pat. No. 10,992,226, issued Apr. 27, 2021, entitled "Startup Detection for Parallel Power Converters", assigned to the assignee of the present invention, the contents of which are incorporated by reference.

Another consideration in operating multi-level converter cells is attaining (i.e., precharging) and maintaining fly capacitor voltages that are essentially fully proportionally balanced so that all switches are subjected to a similar voltage stress, since unbalanced fly capacitors can lead to breakdown of a switch (particularly FET switches) due to exposure to high voltages. One solution to both pre-charging capacitor voltages and operational balancing of capacitor voltages in a multi-level DC-to-DC converter circuit is to provide a parallel "shadow" circuit that conditionally couples a fly capacitor to a voltage source or other circuit to pre-charge that capacitor, or conditionally couples two or more fly capacitors together to transfer charge from a higher voltage capacitor to a lower voltage capacitor, or conditionally couples a fly capacitor to a voltage sink to discharge that capacitor, all under the control of real-time capacitor voltage measurements. Each parallel "shadow" circuit may comprise a switch and a resistor coupled in parallel with a main switch that is part of a multi-level converter cell (in some cases, one switch-resistor pair may span two series-connected switches). This particular solution for pre-charging and/or balancing charge on fly capacitors is very fast, provides slow pre-charging of the fly capacitors during a pre-charge period, protects switches from in-rush current, and provides stable voltages for converter cell switches. Details of this solution, as well as alternative pre-charging and charge balancing solutions, are taught in U.S. Pat. No. 10,720,843, issued Jul. 21, 2020, entitled "Multi-Level DC-DC Converter with Lossy Voltage Balancing", assigned to the assignee of the present invention, the contents of which are incorporated by reference.

Another solution to balancing capacitor voltages in a multi-level DC-to-DC converter circuit is to provide a lossless voltage balancing solution where out-of-order state transitions of a multi-level DC-to-DC converter cell are allowed to take place during normal operation. The net effect of out-of-order state transitions is to increase or decrease the voltage across specific fly capacitors, thus preventing voltage overstress on the main switches of the DC-to-DC converter. In some embodiments, restrictions are placed on the overall sequence of state transitions to reduce or avoid transition state toggling, thereby allowing each capacitor an opportunity to have its voltage steered as necessary, rather than allowing one capacitor to be voltage balanced before voltage balancing another capacitor. Details of this solution, as well as alternative charge balancing solutions, are taught in U.S. Pat. No. 10,770,974, issued Sep. 8, 2020, entitled "Multi-Level DC-DC Converter with Lossless Voltage Balancing", assigned to the assignee of the present invention, the contents of which are incorporated by reference.

An additional consideration for some embodiments is enabling operation of multi-level converter cells such that voltages can be generated in boundaries zones between voltage levels. "Boundary zones" represent unattainable output voltages for conventional multi-level DC-to-DC converter circuits. In order to generate output voltages within a boundary zone, some embodiments essentially alternate (toggle) among adjacent (or even nearby) zones by setting states of the converter cell switches in a boundary zone transition pattern. For example, a 3-level DC-to-DC converter circuit may operate in Zone 1 for a selected time and in adjacent Zone 2 for a selected time. Thus, Zones 1 and 2 are treated as a single "super-zone". More generally, in some cases, it may be useful to create super-zones using non-adjacent zones or using more than two zones (adjacent and/or non-adjacent). Details of this solution are taught in U.S. Pat. No. 10,720,842, issued Jul. 21, 2020, entitled "Multi-Level DC-DC Converter with Boundary Transition Control", assigned to the assignee of the present invention, the contents of which are incorporated by reference.

Yet another consideration for some embodiments is protection of the main power switches and other components within a power converter from stress conditions, particular from voltages that exceed the breakdown voltage of such switches (particularly FET switches). One means for protecting a multi-level power converter uses at least one high-voltage FET switch while allowing all or most other main power switches to be low-voltage FET switches.

As should be clear, the multi-level power converter embodiments described in this disclosure may be synergistically combined with the teachings of one or more of the additional control and operational circuits and methods described in this section.

General Benefits and Advantages of Multi-Level Power Converters

Embodiments of the current invention improve the power density and/or power efficiency of incorporating circuits and circuit modules or blocks. As a person of ordinary skill in the art should understand, a system architecture is beneficially impacted utilizing embodiments of the current invention in critical ways, including lower power and/or longer battery life. The current invention therefore specifically encompasses system-level embodiments that are creatively enabled by inclusion in a large system design and application.

More particularly, multi-level power converters provide or enable numerous benefits and advantages, including:
  adaptability to applications in which input and/or output voltages may have a wide dynamic-range (e.g., varying battery input voltage levels, varying output voltages);
  efficiency improvements on the run-time of devices operating on portable electrical energy sources (batteries, generators or fuel cells using liquid or gaseous fuels, solar cells, etc.);
  efficiency improvements where efficiency is important for thermal management, particularly to protect other components (e.g., displays, nearby ICs) from excessive heat;
  enabling design optimizations for power efficiency, power density, and form-factor of the power converter—for example, smaller-size multi-level power converters may allow placing power converters in close proximity to loads, thus increasing efficiency, and/or to lower an overall bill of materials;

the ability to take advantage of the performance of smaller, low voltage transistors;

adaptability to applications in which power sources can vary widely, such as batteries, other power converters, generators or fuel cells using liquid or gaseous fuels, solar cells, line voltage (AC), and DC voltage sources (e.g., USB, USB-C, power-over Ethernet, etc.);

adaptability to applications in which loads may vary widely, such as ICs in general (including microprocessors and memory ICs), electrical motors and actuators, transducers, sensors, and displays (e.g., LCDs and LEDs of all types);

the ability to be implemented in a number of IC technologies (e.g., MOSFETs, GaN, GaAs, and bulk silicon) and packaging technologies (e.g., flip chips, ball-grid arrays, wafer level scale chip packages, wide-fan out packaging, and embedded packaging).

The advantages and benefits of multi-level power converters enable usage in a wide array of applications. For example, applications of multi-level power converters include portable and mobile computing and/or communication products and components (e.g., notebook computers, ultra-book computers, tablet devices, and cell phones), displays (e.g., LCDs, LEDs), radio-based devices and systems (e.g., cellular systems, WiFi, Bluetooth, Zigbee, Z-Wave, and GPS-based devices), wired network devices and systems, data centers (e.g., for battery-backup systems and/or power conversion for processing systems and/or electronic/optical networking systems), internet-of-things (IOT) devices (e.g., smart switches and lights, safety sensors, and security cameras), household appliances and electronics (e.g., set-top boxes, battery-operated vacuum cleaners, appliances with built-in radio transceivers such as washers, dryers, and refrigerators), AC/DC power converters, electric vehicles of all types (e.g., for drive trains, control systems, and/or infotainment systems), and other devices and systems that utilize portable electricity generating sources and/or require power conversion.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Methods

Figure 9:
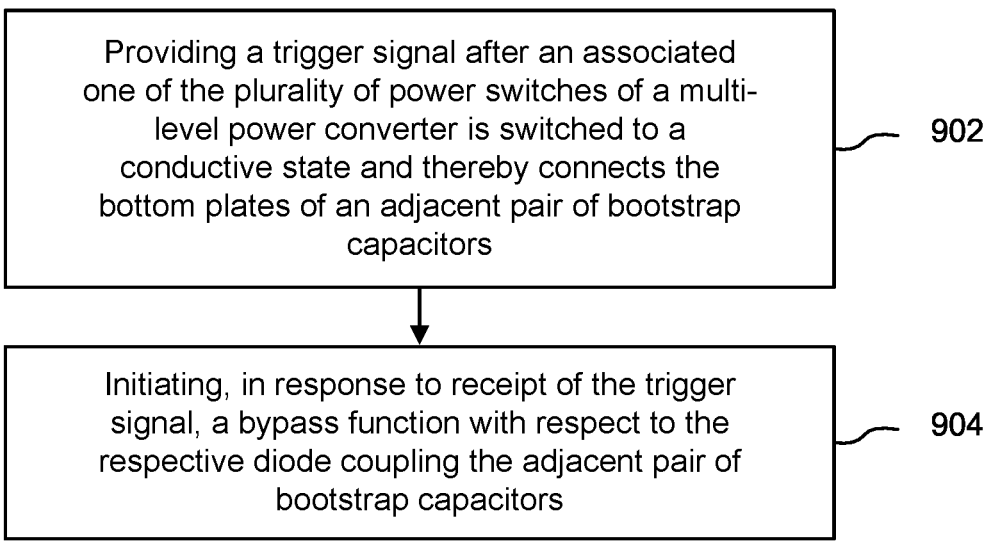
FIG. 9 is a process flow chart showing one method for transferring charge among a plurality of bootstrap capacitors of a multi-level power converter having a plurality of power switches, each bootstrap capacitor having a top plate and a bottom plate, wherein the top plates of each adjacent pair of bootstrap capacitors are coupled by a respective diode within a diode stack.

Another aspect of the invention includes methods for transferring charge among a plurality of bootstrap capacitors of a multi-level power converter. For example, FIG. 9 is a process flow chart 900 showing one method for transferring charge among a plurality of bootstrap capacitors of a multi-level power converter having a plurality of power switches, each bootstrap capacitor having a top plate and a bottom plate, wherein the top plates of each adjacent pair of bootstrap capacitors are coupled by a respective diode within a diode stack. The method includes: providing a trigger signal after an associated one of the plurality of power switches is switched to a conductive state and thereby connects the bottom plates of an adjacent pair of bootstrap capacitors (Block 902); and initiating, in response to receipt of the trigger signal, a bypass function with respect to the respective diode coupling the adjacent pair of bootstrap capacitors (Block 904).

Additional aspects of the above method may include one or more of the following: automatically terminating the bypass function after the bottom plates of the adjacent pair of bootstrap capacitors are disconnected; automatically terminating the bypass after the associated one of the plurality of power switches is switched to a non-conductive state and thereby disconnects the bottom plates of the adjacent pair of bootstrap capacitors; synchronously terminating the bypass function before the associated one of the plurality of power switches is switched to a non-conductive state and thereby disconnects the bottom plates of the adjacent pair of bootstrap capacitor.

Fabrication Technologies & Options

In various embodiments of multi-level power converters, it may be beneficial to use specific types of capacitors, particularly for the fly capacitors. For example, it is generally useful for such capacitors to have low equivalent series resistance (ESR), low DC bias degradation, high capacitance, and small volume. Low ESR is especially important for multi-level power converters that incorporate additional switches and fly capacitors to increase the number of voltage levels. Selection of a particular capacitor should be made after consideration of specifications for power level, efficiency, size, etc. Various types of capacitor technologies may be used, including ceramic (including multi-layer ceramic capacitors), electrolytic capacitors, film capacitors (including power film capacitors), and IC-based capacitors. Capacitor dielectrics may vary as needed for particular applications, and may include dielectrics that are paraelectric, such as silicon dioxide ($SiO_2$), hafnium dioxide ($HFO_2$), or aluminum oxide $Al_2O_3$. In addition, multi-level power converter designs may beneficially utilize intrinsic parasitic capacitances (e.g., intrinsic to the power FETs) in conjunction with or in lieu of designed capacitors to reduce circuit size and/or increase circuit performance. Selection of capacitors for multi-level power converters may also take into account such factors as capacitor component variations, reduced effective capacitance with DC bias, and ceramic capacitor temperature coefficients (minimum and maximum temperature operating limits, and capacitance variation with temperature).

Similarly, in various embodiments of multi-level power converters, it may be beneficial to use specific types of inductors. For example, it is generally useful for the inductors to have low DC equivalent resistance, high inductance, and small volume.

The controller(s) used to control startup and operation of a multi-level power converter may be implemented as a microprocessor, a microcontroller, a digital signal processor (DSP), register-transfer level (RTL) circuitry, and/or combinatorial logic.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A charging circuit configured to provide charge transfer among a plurality of bootstrap capacitors of a power converter having a plurality of power switches, each bootstrap capacitor having a top plate and a bottom plate, wherein the top plates of each adjacent pair of bootstrap capacitors are coupled by a respective diode within a diode stack, the charging circuit including two or more trigger-bypass circuits each coupled to a respective diode within the diode stack and configured to initiate a bypass function with respect to the respective diode in response to receipt of an associated trigger signal, and to provide a trigger signal after an associated one of the plurality of power switches is switched to a conductive state and thereby connects the bottom plates of an adjacent pair of bootstrap capacitors, wherein each trigger-bypass circuit includes:

(a) a first PFET having a conduction channel coupled between the cathode and the anode of the respective diode and a gate coupled to the associated trigger signal; and (b) a second PFET having a conduction channel coupled between the cathode of the respective diode and a gate of the first PFET and a gate coupled to the anode of the respective diode.

2. The invention of claim 1, wherein the diodes within the diode stack include explicit circuit components.

3. The invention of claim 1, wherein the diodes within the diode stack include intrinsic diodes of PFET switches within the trigger-bypass circuits.

4. The invention of claim 1, wherein each trigger-bypass circuit automatically terminates the bypass function after the adjacent pair of bootstrap capacitors reach a sufficient voltage differential after the bottom plates of the adjacent pair of bootstrap capacitors are disconnected.

5. The invention of claim 1, wherein each trigger-bypass circuit automatically terminates the bypass function after the associated one of the plurality of power switches is switched to a non-conductive state and thereby disconnects the bottom plates of the adjacent pair of bootstrap capacitors.

6. The invention of claim 1, wherein each trigger-bypass circuit synchronously terminates the bypass function before the associated one of the plurality of power switches is switched to a non-conductive state and thereby disconnects the bottom plates of the adjacent pair of bootstrap capacitor.

7. The invention of claim 1, further including a bypass circuit coupled to a respective diode within the diode stack and configured to initiate a bypass function with respect to the respective diode in response to receipt of an associated trigger signal from an adjacent trigger-bypass circuit.

8. The invention of claim 7, wherein the diodes within the diode stack include intrinsic diodes of PFET switches within the bypass circuit.

9. The invention of claim 7, wherein the bypass circuit includes:

(a) a first PFET having a conduction channel coupled between the cathode and the anode of the respective diode and a gate coupled to the trigger signal from the adjacent trigger-bypass circuit; and (b) a second PFET having a conduction channel coupled between the cathode of the respective diode and a gate of the first PFET and a gate coupled to the anode of the respective diode.

10. The invention of claim 7, wherein the bypass circuit includes:

(a) a set-reset latch having a first input coupled to the associated trigger signal and a second input coupled to an associated control signal; and (b) a PFET having a conduction channel coupled between the cathode and the anode of the respective diode and a gate coupled to the output of the set-reset latch.

11. The invention of claim 10, wherein the associated control signal is synchronous with a gate control signal for the associated one of the plurality of power switches but earlier in phase.

12. The invention of claim 10, wherein the trigger signal causes the PFET to initiate the bypass function, and the associated control signal causes the PFET to terminate the bypass function.

13. The invention of claim 1, further including a trigger circuit configured to provide a trigger signal to an adjacent trigger-bypass circuit after an associated one of the plurality of power switches is switched to a conductive state and thereby connects the bottom plates of an adjacent pair of bootstrap capacitors.

14. The invention of claim 13, wherein the trigger circuit includes:

(a) an inverter having an input coupled to a drain of an associated one of the plurality of power switches, and an output;

(b) an NFET having a gate coupled to the output of the inverter, and a conduction channel coupled between a first potential and the adjacent trigger-bypass circuit, wherein the NFET is configured to provide a trigger signal to the adjacent trigger-bypass circuit after the associated one of the plurality of power switches is switched to a conductive state.

15. The invention of claim 1, wherein the power converter is a multi-level power converter.

16. A charging circuit configured to provide charge transfer among a plurality of bootstrap capacitors of a power converter having a plurality of power switches, each bootstrap capacitor having a top plate and a bottom plate, wherein the top plates of each adjacent pair of bootstrap capacitors are coupled by a respective diode within a diode stack, the charging circuit including two or more trigger-bypass circuits each coupled to a respective diode within the diode stack and configured to initiate a bypass function with respect to the respective diode in response to receipt of an associated trigger signal, and to provide a trigger signal after an associated one of the plurality of power switches is switched to a conductive state and thereby connects the bottom plates of an adjacent pair of bootstrap capacitors, wherein at least one trigger-bypass circuit includes:

(a) an inverter having an input coupled to a drain of an associated one of the plurality of power switches, and an output;

(b) an NFET having a gate coupled to the output of the inverter, and a conduction channel coupled between a first potential and an adjacent trigger-bypass circuit, wherein the NFET is configured to provide a trigger signal to the adjacent trigger-bypass circuit after the associated one of the plurality of power switches is switched to a conductive state.

17. The invention of claim 16, wherein the diodes within the diode stack include explicit circuit components.

18. The invention of claim 16, wherein each trigger-bypass circuit automatically terminates the bypass function after the adjacent pair of bootstrap capacitors reach a sufficient voltage differential after the bottom plates of the adjacent pair of bootstrap capacitors are disconnected.

19. The invention of claim 16, wherein each trigger-bypass circuit automatically terminates the bypass function after the associated one of the plurality of power switches is switched to a non-conductive state and thereby disconnects the bottom plates of the adjacent pair of bootstrap capacitors.

20. The invention of claim 16, wherein each trigger-bypass circuit synchronously terminates the bypass function before the associated one of the plurality of power switches is switched to a non-conductive state and thereby disconnects the bottom plates of the adjacent pair of bootstrap capacitor.

* * * * *

UNITED STATES PATENT AND TRADEMARK OFFICE
CERTIFICATE OF CORRECTION

| | | |
|---|---|---|
| PATENT NO. | : 12,143,004 B2 | Page 1 of 1 |
| APPLICATION NO. | : 17/752492 | |
| DATED | : November 12, 2024 | |
| INVENTOR(S) | : Gary Chunshien Wu and Gregory Szczeszynski | |

It is certified that error appears in the above-identified patent and that said Letters Patent is hereby corrected as shown below:

In the Specification

In the DETAILED DESCRIPTION:
Column 11, Line 52, change "applied to the 9 input" to --applied to the $\overline{S}$ input--.

Column 12, Line 12, change "the value of V and" to --the value of $V_{IN}$ and--.

Column 14, Lines 40-41, change "U.S. Patent Application Ser. No." to --U.S. Patent Application No.--.

Signed and Sealed this
Twenty-fourth Day of December, 2024

Derrick Brent
*Acting Director of the United States Patent and Trademark Office*